US012810956B2

(12) United States Patent
Kim et al.

(10) Patent No.: US 12,810,956 B2
(45) Date of Patent: Nov. 24, 2026

(54) BUILT-IN-SELF-TEST LOGIC, MEMORY DEVICE INCLUDING BUILT-IN-SELF-TEST LOGIC, AND TEST METHOD FOR MEMORY MODULE

(71) Applicant: SAMSUNG ELECTRONICS CO., LTD., Suwon-si (KR)

(72) Inventors: Jaehyeok Kim, Suwon-si (KR); Eunhye Oh, Suwon-si (KR); Gapkyoung Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 177 days.

(21) Appl. No.: 18/945,045

(22) Filed: Nov. 12, 2024

(65) Prior Publication Data

US 2025/0191671 A1 Jun. 12, 2025

(30) Foreign Application Priority Data

Dec. 8, 2023 (KR) ........................ 10-2023-0178051

(51) Int. Cl.
*G11C 29/36* (2006.01)
*G11C 29/12* (2006.01)
*G11C 29/18* (2006.01)

(52) U.S. Cl.
CPC .......... *G11C 29/36* (2013.01); *G11C 29/1201* (2013.01); *G11C 29/18* (2013.01); *G11C 2029/3602* (2013.01)

(58) Field of Classification Search
CPC ..... G11C 29/36; G11C 29/1201; G11C 29/18; G11C 2029/3602; G11C 5/04; G11C 29/14; G11C 29/56004
USPC .......................................................... 365/201
See application file for complete search history.

(56) References Cited

U.S. PATENT DOCUMENTS

| | | | |
|---|---|---|---|
| 6,671,843 B1 | 12/2003 | Kebichi et al. | |
| 6,922,803 B2 | 7/2005 | Nakao et al. | |
| 6,950,974 B1 | 9/2005 | Wohl et al. | |
| 6,970,798 B1 | 11/2005 | Cao et al. | |
| 7,010,736 B1 | 3/2006 | Teh et al. | |
| 7,284,167 B2 | 10/2007 | Lee et al. | |
| 7,424,660 B2 | 9/2008 | Kebichi et al. | |
| 7,426,668 B2 | 9/2008 | Mukherjee et al. | |
| 9,443,614 B2 | 9/2016 | Hollis | |
| 11,740,270 B2 | 8/2023 | Lee et al. | |
| 2003/0149927 A1 | 8/2003 | Wang | |
| 2008/0077831 A1 | 3/2008 | Sasaki et al. | |
| 2020/0170104 A1* | 5/2020 | Kim | H05K 1/0268 |

* cited by examiner

*Primary Examiner* — Huan Hoang
(74) *Attorney, Agent, or Firm* — Sughrue Mion, PLLC

(57) ABSTRACT

A memory device may include a memory module including a memory cell array and a plurality of input/output circuits and a test logic circuit configured to perform a self-test on the memory module, wherein the test logic circuit may include a pattern generator configured to generate a pattern of the memory cell array including diagonal patterns with interval corresponding to a second value I based on a first value d, and $I=2^d$.

20 Claims, 30 Drawing Sheets

BUILT-IN-SELF-TEST LOGIC, MEMORY DEVICE INCLUDING BUILT-IN-SELF-TEST LOGIC, AND TEST METHOD FOR MEMORY MODULE

CROSS-REFERENCE TO RELATED APPLICATION

This application is based on and claims priority under 35 U.S.C. § 119 to Korean Patent Application No. 10-2023-0178051, filed on Dec. 8, 2023, in the Korean Intellectual Property Office, the disclosure of which is incorporated by reference herein in its entirety.

BACKGROUND

The disclosure relates to a semiconductor memory, and more particularly, to memory built-in-self-test logic, a memory device including the built-in-self-test logic, and a test method for a memory module.

Semiconductor memory may be classified into volatile memory devices, such as static random access memory (SRAM) and dynamic random access memory (DRAM), where stored data is lost when the power supply is cut off, and non-volatile memory devices, such as flash memory devices, phase-change random access memory (PRAM), magnetic random access memory (MRAM), resistive random access memory (RRAM), and ferroelectric random access memory (FRAM), which retain stored data even when the power supply is cut off.

In memory modules, defects may occur due to various factors. Defects that occur during the manufacturing process of the memory module may be detected during testing of the memory module.

SUMMARY

Embodiments provide built-in self-test logic with improved performance, a memory device including the built-in self-test logic, and a test method for a memory module.

According to an aspect of an example embodiment, there is provided a memory device including: a memory module including a memory cell array and a plurality of input/output circuits, wherein the memory cell array includes a plurality of memory partitions, a same number of memory cells are arranged in a column direction in each of the plurality of memory partitions, a number of the plurality of input/output circuits is equal to a number of the plurality of memory partitions, and each of the plurality of input/output circuits inputs data into one memory partition in 1-bit units; and a test logic circuit configured to perform a self-test on the memory module, wherein the test logic circuit includes a pattern generator configured to generate a pattern of the memory cell array including diagonal patterns with an interval corresponding to a second value I based on a first value d, and $I=2^d$.

According to an aspect of an example embodiment, there is provided a test method for a memory module, wherein the memory module includes a memory cell array and a plurality of input/output circuits, wherein the memory cell array includes a plurality of memory partitions, a same number of memory cells are arranged in a column direction in each of the plurality of memory partitions, a number of the plurality of input/output circuits is equal to a number of the plurality of memory partitions, and each of the plurality of input/output circuits inputs data into one memory partition in 1-bit units, the test method including: generating a pattern including diagonal patterns with interval corresponding to a second value I based on a first value d, wherein $I=2^d$; and testing the memory module with the pattern.

According to an aspect of an example embodiment, there is provided a test logic circuit configured to perform a self-test on a memory module, the test logic circuit including: the memory module including a memory cell array and a plurality of input/output circuits, wherein the memory cell array includes a plurality of memory partitions a same number of memory cells are arranged in a column direction in each of the plurality of memory partitions, a number of the plurality of input/output circuits is equal to a number of the plurality of memory partitions, and each of the plurality of input/output circuits inputs data into one memory partition in 1-bit units, wherein the test logic circuit includes a pattern generator configured to generate a pattern including diagonal patterns with interval corresponding to a second value I based on a first value d, and $I=2^d$.

BRIEF DESCRIPTION OF THE DRAWINGS

The above and/or other aspects will be more clearly understood from the following detailed description taken in conjunction with the accompanying drawings, in which.

DETAILED DESCRIPTION

Hereinafter, various embodiments of the disclosure are described with reference to the accompanying drawings.

Hereinafter, for convenience of explanation, terms such as "test pattern" and "pattern" are used interchangeably. These terms may have the same meaning or different meanings depending on the context of the embodiments, and the meaning of each term is understood according to the context of the embodiments to be described.

Figure 1:
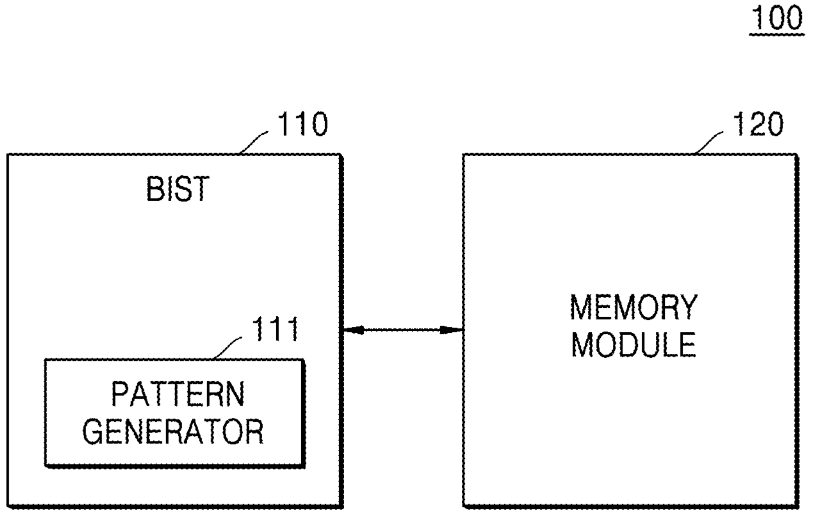
FIG. 1 is a block diagram illustrating a memory device according to an embodiment.

FIG. 1 is a block diagram illustrating a memory device according to an embodiment.

FIG. 1 is a block diagram showing a memory device 100 according to an embodiment. Referring to FIG. 1, the memory device 100 may include a built-in-self-test (BIST) logic circuit 110 and a memory module 120. The BIST logic circuit 110 may be configured to perform a self-test on the memory module 120. During the manufacturing process of the memory module 120, the BIST logic circuit 110 may be used to detect defects in the memory module 120.

The BIST logic circuit 110 may perform a test operation to detect defects in the memory module 120. For example, the BIST logic circuit 110 may perform a test operation to determine whether the memory module 120 normally performs various operations (e.g., write operations, read operations, etc.). Hereinafter, in order to easily explain the technical idea of the disclosure, it is assumed that the BIST logic circuit 110 tests write and read operations of the memory module 120. In addition, it is assumed that the memory module 120 is a magnetic random access memory (MRAM) device. However, the scope of the disclosure is not limited thereto. For example, the BIST logic circuit 110 may be configured to detect various defects occurring in the memory module 120. The memory module 120 may be implemented with various memories, such as static random access memory (SRAM), dynamic random access memory (DRAM), flash memory, phase-change random access memory (PRAM), magnetic random access memory (MRAM), resistive random access memory (RRAM), and ferroelectric random access memory (FRAM).

The BIST logic circuit 110 may be configured to control the memory module 120 to test write and read operations of the memory module 120. For example, the BIST logic circuit 110 may generate a test pattern to be written in the memory module 120 and write the generated test pattern to the memory module 120. The BIST logic circuit 110 may read the test pattern written in the memory module 120 and compare the read test pattern with the original test pattern to determine fail bits occurring in the memory module 120. The BIST logic circuit 110 may evaluate the reliability of the memory module 120.

In an embodiment, the test pattern may be used to determine whether the read and write operations of a plurality of memory cells included in the memory module 120 are defective.

Here, the test pattern may be a bit string or a bit sequence created for a specific purpose with certain rules. In addition, the test patterns may take various forms. For example, a specific bit string, sequence, or periodic repetition pattern may be used as a test pattern.

The BIST logic circuit 110 according to an embodiment may include a pattern generator 111. The pattern generator 111 may generate a test pattern based on the addresses of each of the plurality of memory cells included in the memory module 120.

For example, the pattern generator 111 may specify a bit value for each of the plurality of memory cells based on the address of each of the plurality of memory cells included in the memory module 120.

That is, a test pattern may be a set of bit values to be written to a corresponding memory cell based on the address of the memory cell.

In addition, the memory module 120 may include a memory cell array including a plurality of memory partitions. The pattern generator 111 may generate a test pattern of the memory cell array included in the memory module 120. That is, the pattern generator 111 may generate a test pattern that specifies bit values for all memory cells included in the memory cell array.

Here, the same number of memory cells may be disposed in each of the plurality of memory partitions in a first direction (e.g., column direction). In addition, the memory module 120 may include a plurality of input/output circuits. Here, the input/output circuit may input data into one memory partition in 1-bit units. In addition, the input/output circuit may output data from one memory partition in 1-bit units. Additionally, the number of input/output circuits may be equal to the number of memory partitions. Here, the pattern generator 111 may generate a series of bit streams so that the number of bits included in the series corresponds to the number of input/output circuits.

The pattern generator 111 may be configured to provide a series of bit strings to a plurality of input/output circuits included in the memory module 120. In addition, the pattern generator 111 may be configured to continuously provide a series of bit strings to a plurality of input/output circuits until the input/output circuits input bit values of all memory cells included in the memory partition. Here, a plurality of provided series of bit strings may correspond to the test pattern until the input/output circuit inputs bit values of all memory cells included in the memory partition.

In this case, the pattern generator 111 may generate a test pattern such that diagonal patterns having an interval I are included in the test pattern. Here, the diagonal pattern may mean a pattern in which the same value is written to memory cells arranged diagonally in a memory cell array.

In addition, the pattern generator 111 may adjust the interval between the diagonal patterns by adjusting the interval I. Here, the interval I is adjustable and may be entered into the pattern generator 111 by the user.

According to an embodiment, by adjusting the interval I between the diagonal patterns, the degree of interference received by adjacent memory cells included in the memory module 120 is intensified, which has the effect of quickly detecting defects. For example, referring to FIG. 5, by sequentially reducing the interval I between the diagonal patterns to 8, 4, and 2, defects according to the degree of interference received by adjacent memory cells included in the memory module 120 may be quickly detected at regular intervals. Thus, while the random patterns of the comparative example cannot test for defects according to the degree of interference received by adjacent memory cells at regular intervals, the diagonal patterns of embodiments can quickly test for defects according to the degree of interference received by adjacent memory cells at regular intervals.

In addition, according to an embodiment, there is an effect of improving test coverage by generating various test patterns.

The operations of the BIST logic circuit 110 and the pattern generator 111 according to an embodiment are described in more detail with reference to the drawings below.

Figure 2:
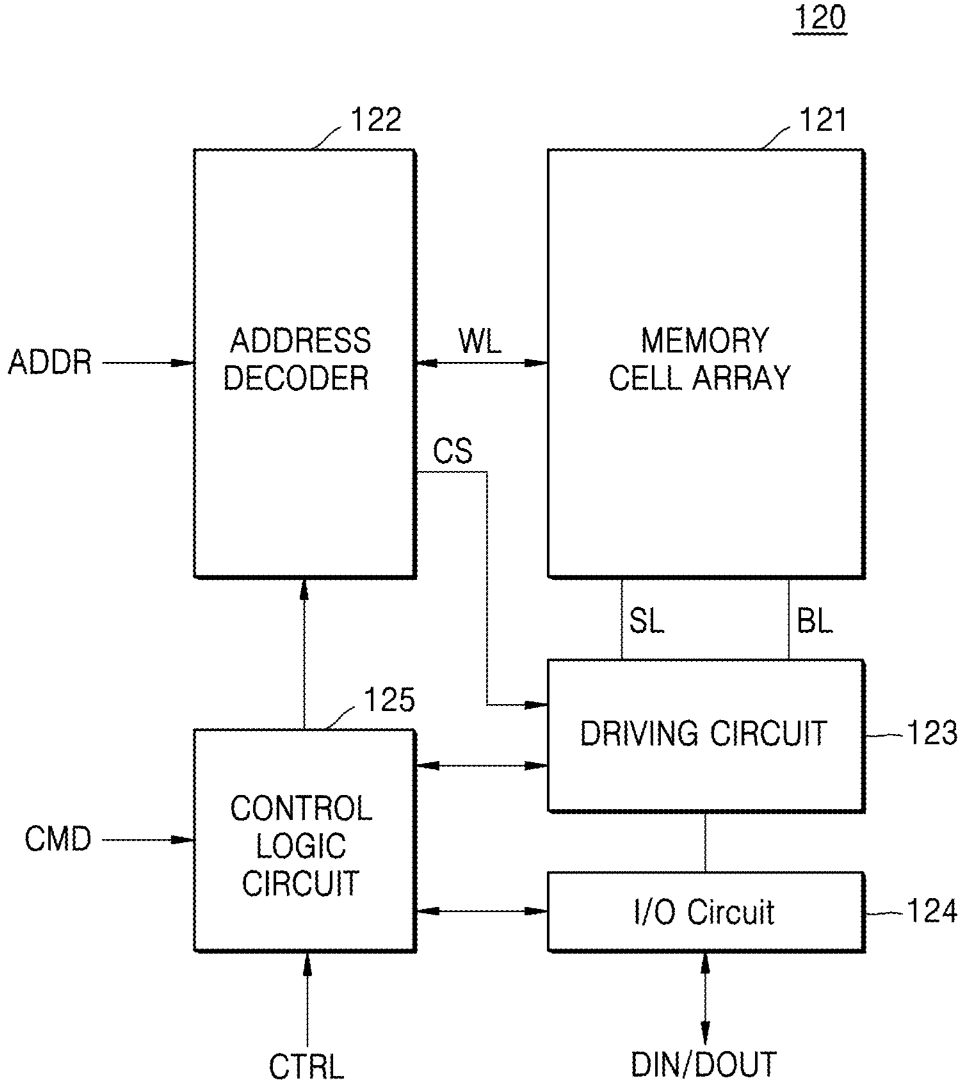
FIG. 2 is a block diagram showing an example of the memory module of FIG. 1.

FIG. 2 is a block diagram showing an example of the memory module 120 of FIG. 1.

Referring to FIG. 2, the memory module 120 may include a memory cell array 121, an address decoder 122, a write driver/sense amplifier 123 (hereinafter, referred to as a "driving circuit" for convenience of explanation), an input/output circuit 124, and a control logic circuit 125.

The memory cell array 121 may include a plurality of memory cells. The plurality of memory cells may be connected to word lines WL, bit lines BL, and source lines SL, respectively. In an embodiment, each of the plurality of memory cells may be a MRAM cell, but embodiments are not limited thereto.

The address decoder 122 may be connected to the memory cell array 121 through the word lines WL. The address decoder 122 may receive an address ADDR from the BIST logic circuit 110 (or an external device, for example, a memory controller (not shown)) and decode the received address ADDR. The address decoder 122 may control the voltage of each word line WL based on the decoding result. The address decoder 122 may output a column selection signal CS based on the decoding result.

The driving circuit 123 may be connected to the memory cell array 121 through source lines SL and bit lines BL. The driving circuit 123 may select the source lines SL and bit lines BL in response to the column selection signal CS. Alternatively, the driving circuit 123 may read data stored in a plurality of memory cells included in the memory cell array 121 by detecting the voltage of the source lines SL or the bit lines BL.

The input/output circuit 124 may receive input data DIN from the BIST logic circuit 110 (or an external device, for example, the memory controller) and transfer the received input data DIN to the driving circuit 123. In an embodiment, the driving circuit 123 may write input data DIN to a plurality of memory cells included in the memory cell array 121 by controlling the voltages of the source lines SL and bit lines BL based on the input data DIN. The input/output circuit 124 may receive output data DOUT from the driving circuit 123 and transmit the received output data DOUT to the BIST logic circuit 110 (or an external device, for example, memory controller). The input/output circuit 124 is described in more detail with reference to FIG. 4.

In an embodiment, while the BIST logic circuit 110 performs a test operation, the input data DIN may refer to a test pattern to be written in the memory cells of the memory cell array 121, and output data DOUT may refer to data read from memory cells in which the test pattern is written.

The control logic circuit 125 may receive a command CMD or control signal CTRL from the BIST logic circuit 110 (or an external device, for example, memory controller) and control the operation of the memory module 120 in response to the received signals. For example, the control logic circuit 125 may control the driving circuit 123 so that the driving circuit 123 operates as a write driver during a write operation of the memory module 120 and operates as a sense amplifier during a read operation of the memory module 120.

Figure 3A:
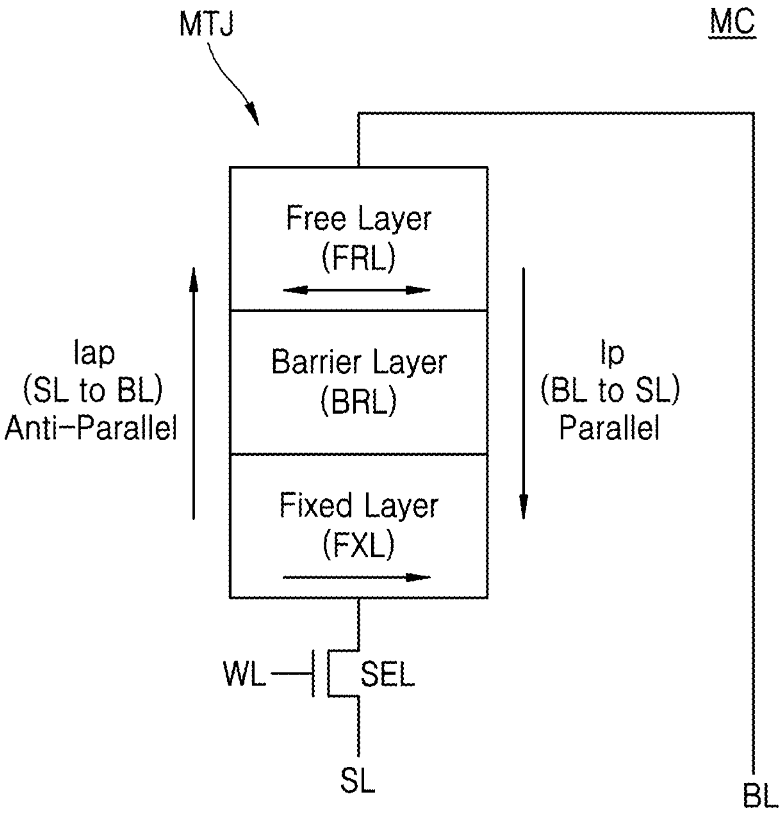
FIGS. 3A and 3B are diagrams for explaining memory cells included in the memory cell array of FIG. 2.
Figure 3B:
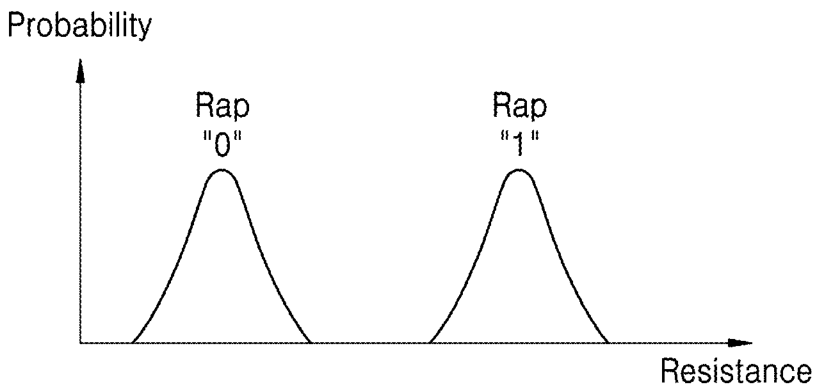

FIGS. 3A and 3B are diagrams for explaining memory cells included in the memory cell array 121 of FIG. 2. Hereinafter, in order to easily explain the technical features, embodiments are described based on a write operation of the memory module 120. Referring to FIG. 3A, an example of structure for one memory cell MC is described, but embodiments are not limited thereto. In an embodiment, the horizontal axis of FIG. 3B indicates the resistance of the variable resistance element MTJ of the memory cell MC, and the vertical axis indicates probability.

Referring to FIGS. 2, 3A, and 3B, the memory cell MC may include a variable resistance element MTJ and a selection transistor SEL. The variable resistance element MTJ may be implemented as a magnetic tunnel junction. The variable resistance element MTJ may be located between the bit line BL and the selection transistor SEL and connected to the bit line BL and the selection transistor SEL. The selection transistor SEL may be located between the variable resistance element MTJ and the source line SL and connected to the variable resistance element MTJ and the source line SL, and may operate in response to the voltage of the word line WL.

In an embodiment, the memory module 120 may write data to the memory cells MC by adjusting the resistance values of the memory cells MC. For example, as shown in FIG. 3A, the variable resistance element MTJ may include a free layer FRL, a barrier layer BRL, and a fixed layer FXL. The barrier layer BRL may be located between the free layer FRL and the fixed layer FXL, the free layer FRL may be connected to the bit line BL, and the fixed layer FXL may be connected to the selection transistor SEL. A magnetization direction of the fixed layer FXL may be fixed to a specific direction, and a magnetization direction of the free layer FRL may be changed depending on specific conditions (e.g., direction of write current). In an embodiment, the variable resistance element MTJ may further include an anti-ferromagnetic layer for fixing the magnetization direction of the fixed layer FXL.

In an embodiment, the free layer FRL may include a material having a changeable magnetization direction. The magnetization direction of the free layer FRL may be changed by electrical or magnetic factors provided from outside or inside the memory cell. The free layer FRL may include a ferromagnetic material containing at least one of cobalt (Co), iron (Fe), and nickel (Ni). For example, the free layer FRL may include at least one selected from FeB, Fe, Co, Ni, Gd, Dy, CoFe, NiFe, MnAs, MnBi, MnSb, $CrO_2$, $MnOFe_2O_3$, $FeOFe_2Od_3$, $NiOFe_2O_3$, $CuOFe_2O_3$, $MgOFe_2O_3$, EuO and $Y_3Fe_5O_{12}$. However, embodiments are not limited thereto.

In an embodiment, the thickness of the barrier layer BRL may be less than the spin diffusion distance. The barrier layer BRL may include a non-magnetic material. As an example, the barrier layer BRL may include at least one selected from magnesium (Mg), titanium (Ti), aluminum (Al), oxides of magnesium-zinc (MgZn) and magnesium-boron (MgB), and nitrides of titanium (Ti) and vanadium (V). However, embodiments are not limited thereto.

In an embodiment, the fixed layer FXL may have a magnetization direction fixed by the antiferromagnetic layer. The fixed layer FXL may include a ferromagnetic material. For example, the fixed layer FXL may include at least one selected from CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$. In an embodiment, the antiferromagnetic layer may include an antiferromagnetic material. For example, the antiferromagnetic layer may include at least one selected from PtMn, IrMn, MnO, MnS, MnTe, $MnF_2$, $FeCl_2$, FeO, $CoCl_2$, CoO, $NiCl_2$, NiO, and Cr. However, embodiments are not limited thereto. The structure, material, or components of the variable resistance element MTJ described above are only examples, and embodiments are not limited thereto.

As shown in FIG. 3A, depending on the direction of the current lap and Ip flowing through the variable resistance element MTJ, the magnetization direction of the free layer FRL may change. The currents lap and Ip may be generated by controlling the voltages of the bit line BL and the source line SL when the selection transistor SEL is turned on by the voltage of the word line WL.

The anti-balanced current Iap shown in FIG. 3A may flow from the source line SL to the bit line BL. When an anti-balanced current lap flows through the variable resistance element MTJ, the magnetization direction of the free layer FRL may be opposite to that of the fixed layer FXL, and this state is called an anti-parallel state. Conversely, the balanced current Ip shown in FIG. 3A may flow from the bit line BL to the source line SL. When the balanced current Ip flows through the variable resistance element MTJ, the magnetization direction of the free layer FRL may be the same as that of the fixed layer FXL, and this state is called a parallel state.

When the variable resistance element MTJ is in a semi-balanced state, the variable resistance element MTJ may have an anti-balance resistance Rap, as shown in FIG. 3B. When the variable resistance element MTJ is in a balanced state, the variable resistance element MTJ may have a balance resistance Rp. That is, data may be stored in the memory cell MC depending on the resistance value of the variable resistance element MTJ. By reading the resistance value of the variable resistance element MTJ, data (e.g., bit "1" or bit "0") stored in the first memory cell MC1 may be read.

In an embodiment, data may not be normally written to the memory cell MC due to PVT variation of the memory cell MC, variable resistance element MTJ, or other structures or various factors. For example, when bit "1" is written to the memory cell MC, the semi-balanced current Iap is controlled to flow through the variable resistance element MTJ of the memory cell MC. However, due to various factors of the memory cell MC, even if a sufficient amount of anti-equilibrium current does not flow through the variable resistance element MTJ, or even if a sufficient amount of anti-equilibrium current Iap flows through the variable resistance element MTJ, the resistance value of the variable resistance element MTJ may not be anti-balanced. In this case, data read from the memory cell MC may be bit "0". Likewise, when bit "0" is written to the memory cell MC, the variable resistance element MTJ may not have the balance resistance Rp due to various factors in the memory cell MC. That is, a write failure to a memory cell MC may occur stochastically.

The BIST logic circuit 110 of FIG. 1 may repeatedly perform the operation of detecting defective cells among the memory cells MC by repeatedly performing the operation of writing and checking the test pattern for the memory cells MC. Below, the operation of the BIST logic circuit 110 is described in more detail.

Figure 4:
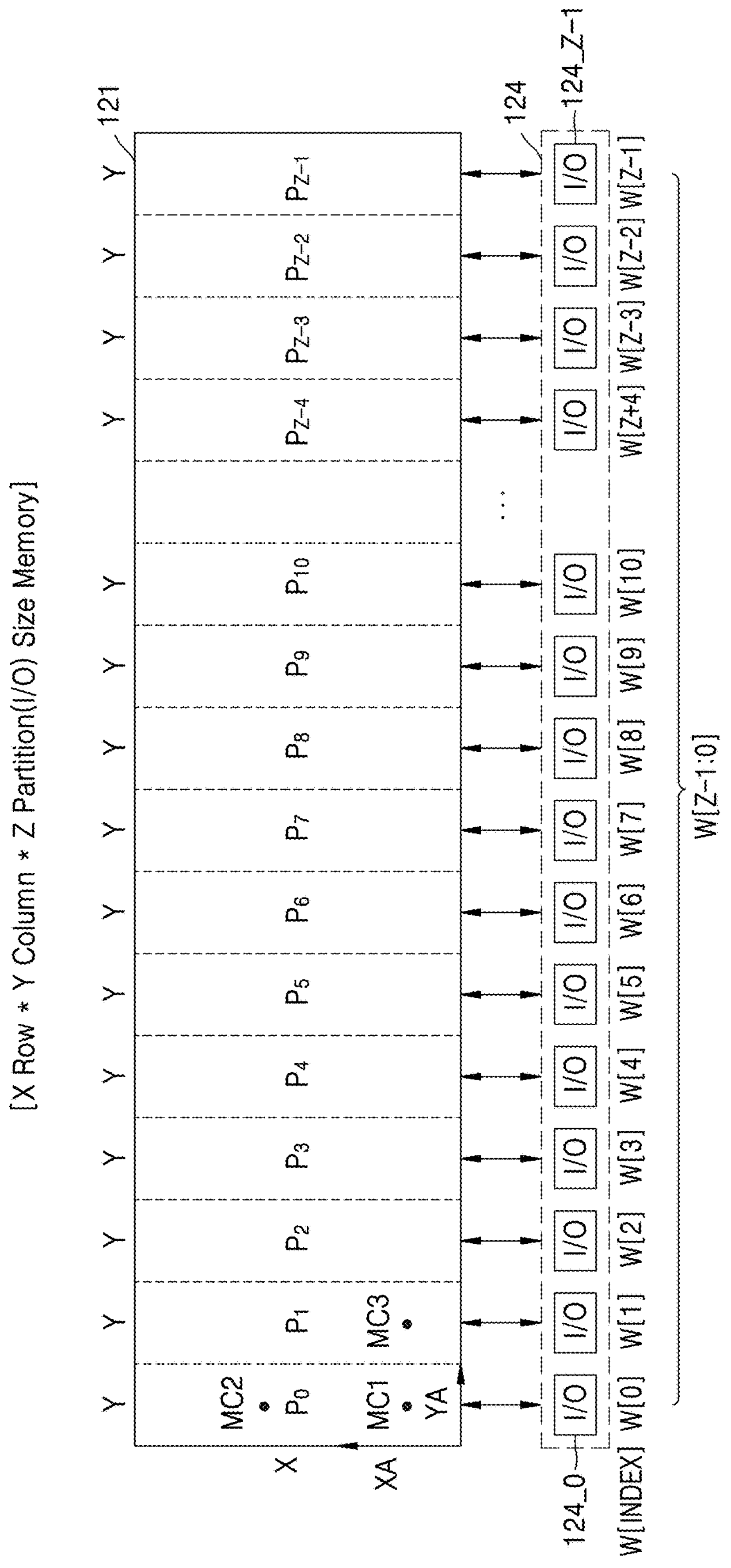
FIG. 4 is a diagram illustrating one memory cell array and input/output circuits in units of 1 bit.

First, with reference to FIG. 4, the structure of the memory cell array described in this specification and terms necessary for description are described.

FIG. 4 is a diagram illustrating one memory cell array and input/output circuits in units of 1 bit.

Referring to FIGS. 3 and 4, the memory cell array 121 may include Z memory partitions P0 to PZ−1. That is, the memory cell array 121 may include a plurality of memory partitions P0 to PZ−1, and the same number of memory cells may be arranged in each of the plurality of memory partitions P0 to PZ−1 in the column direction.

In addition, the input/output circuit 124 may include a plurality of input/output circuits. Here, the input/output circuit 124 may include input/output circuits in 1-bit units. For example, a 0th input/output circuit 124_0 may input data in 1-bit units to the 0th memory partition P0 or output data in 1-bit units from a 0th memory partition P0.

In addition, the number of memory partitions may correspond to the number of input/output circuits in 1-bit units. In this case, the input/output circuit 124 may include Z input/output circuits in 1-bit units.

That is, the memory module 120 includes a plurality of input/output circuits, and the number of input/output circuits is equal to the number of memory partitions. Each of the plurality of input/output circuits may input data into one memory partition in 1-bit units.

In addition, in each memory partition, X memory cells may be arranged in a row direction and Y memory cells may be arranged in a column direction.

In addition, an index, which is location information of the memory partition, may be assigned to each memory partition. In this case, the index INDEX may have values from 0 to Z−1. In addition, the index may be set to increase in the column direction.

For example, referring to FIG. 4, the index INDEX of the zeroth memory partition P0 is 0. X memory cells may be arranged in the column direction (meaning the direction crossing the rows) and Y memory cells may be arranged in the row direction (meaning the direction crossing the columns) in the zeroth memory partition P0. The index INDEX of the first memory partition P1 is 1, and X memory cells may be arranged in the column direction and Y memory cells may be arranged in the row direction. The index of the Z−1 memory partition PZ−1 may be Z−1, X memory cells may be arranged in the column direction, and Y memory cells may be arranged in the row direction.

In addition, the first memory cell MC1 disposed at the lowest and leftmost position in the zero memory partition P0 may be used as a reference point for the column address and row address. For example, the column address and row address values of the first memory cell MC1 may be 0. The row address value of the second memory cell MC2 arranged in the row direction in the first memory cell MC1 may be an increased value compared to the row address of the first memory cell MC1, and the value of the column address of the third memory cell MC3 arranged in the column direction in the first memory cell MC1 may be an increased value compared to the column address of the first memory cell MC1.

In addition, word data W, a series of bit strings, may be defined by collecting bit values that are simultaneously input and output from the input/output circuits during one operation of the input/output circuits.

For example, word data W (W[Z−1:0]), which is a series of bit strings, may be defined by collecting the 0th bit W[0] to the Z−1th bit W[Z−1] that is simultaneously input and output in one operation unit of the input/output circuits.

That is, word data W (W[Z−1:0]) may be a basic data unit for an operation (write or read) of input/output circuits while the BIST logic circuit 110 performs a test operation.

For example, the lowest bit (0th bit), of word data W (W[Z−1:0]) may be configured as a bit input/output from and to the 0th input/output circuit 124_0 to and from the 0th memory partition P0. In addition, the most significant bit (Z−1 bit) of the word data W (W[Z−1:0]) may be configured as a bit input/output from and to the Z−1 input/output circuit 124_Z−1 to and from the Z−1 memory partition PZ−1.

Accordingly, the test pattern may include X*Y word data W (W[Z−1:0]). For example, the input/output circuits may write a test pattern to the memory cell array by inputting word data W (W[Z−1:0]) X*Y times to a plurality of memory partitions.

Let us define each value of X, Y, and Z that determines the size of the memory cell array.

The value of Y, which is the number of memory cells arranged in the first direction in one memory partition, is defined as $2^a$, where a is a positive integer. That is, $Y=2^a$, and is a be a positive integer. Here, the first direction may be a row direction as shown in FIG. 4 (Y giving the number of columns in one partition), but is not limited thereto.

The value of X, which is the number of memory cells arranged in the second direction in one memory partition, is defined to be greater than or equal to the value of Y. That is, X2Y. Here, the second direction may be a column direction as shown in FIG. 4 (X giving a number of rows in one partition), but is not limited thereto.

The bit length of Y is b.

The value of Z, the number of memory partitions, may be a positive integer c.

Moreover, the pattern generator 111 shown in FIG. 1 may generate a test pattern such that diagonal patterns with an interval I are included in the test pattern. In addition, the pattern generator 111 may adjust the interval between diagonal patterns by adjusting the interval I.

The value of the interval I is defined as $2^d$, where the value of d may be a positive integer less than or equal to the value of b. That is, $I=2^d$, and d may be an integer that satisfies $0 \le d \le b$. This is explained in detail with reference to FIG. 5.

Figure 5:
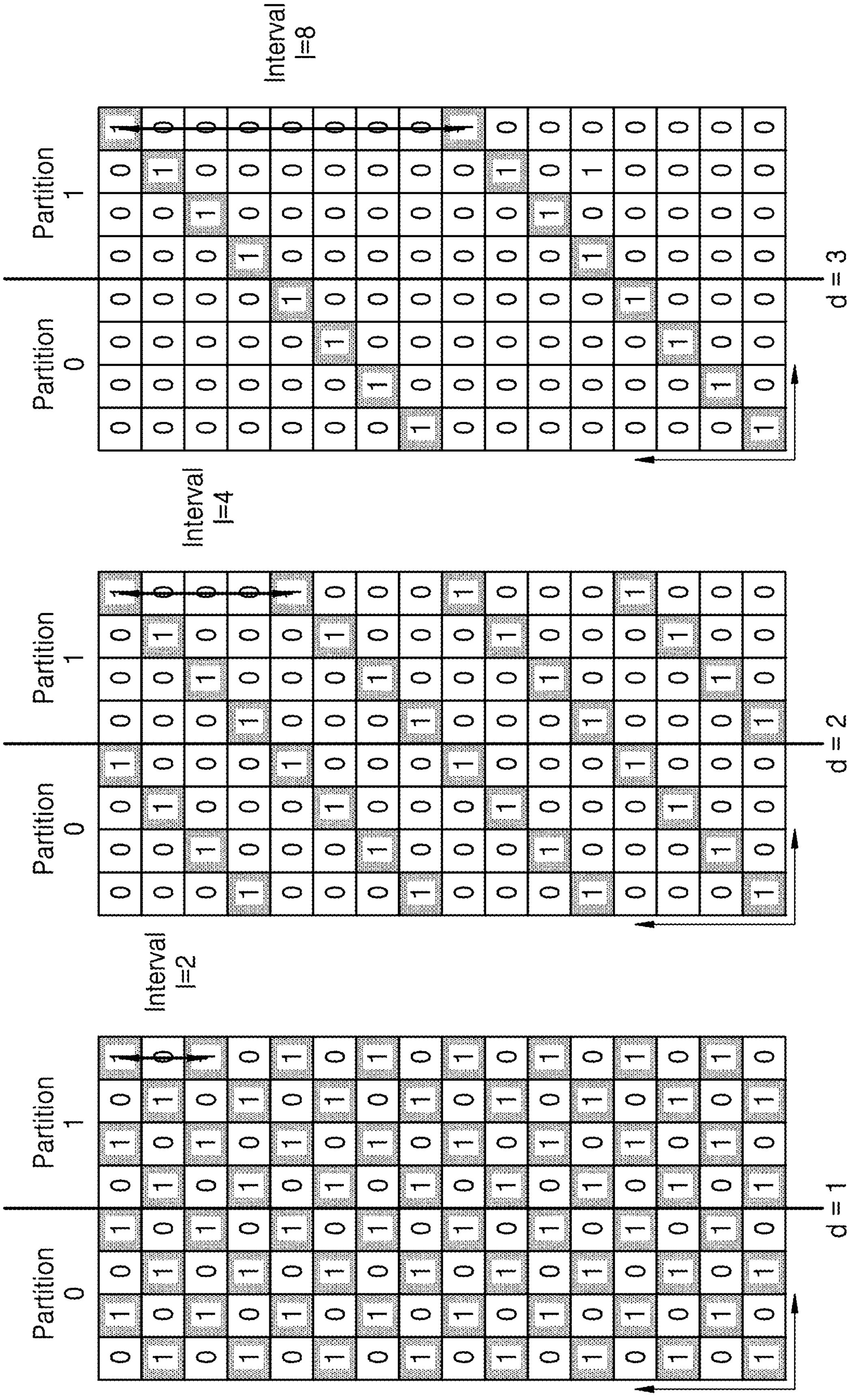
FIG. 5 is a block diagram showing an example of a test pattern including diagonal patterns with interval I.

FIG. 5 is a block diagram showing an example of a test pattern including diagonal patterns with interval I.

Referring to FIG. 5, this diagram shows test patterns to be applied to a memory cell array including 16 (row)*4 (column)*2 (number of partition) memory cells. In this case, referring to FIG. 4, the value of a is 2, the value of b is 4, and the value of c is 2.

The test patterns may have diagonal patterns with the interval I of 2, 4, or 8, depending on the value of d.

For example, referring to FIG. 5, when the value of d is 1, the test pattern may include a diagonal pattern with an interval I of 2. In addition, when the value of d is 2, the test pattern may include a diagonal pattern with an interval I of 4. In addition, when the value of d is 3, the test pattern may include a diagonal pattern with an interval I of 8.

Here, the pattern generator 111 may adjust the interval I to generate a test pattern to include diagonal patterns with the adjusted interval I. That is, the pattern generator 111 may adjust the interval between diagonal patterns by adjusting the interval I.

For example, the pattern generator 111 may adjust the interval I based on the value of d input by the user. Here, the relationship between d and I may be $I=2^d$.

For example, when the value of d is 1, the pattern generator 111 may generate test patterns to include a diagonal pattern with an interval I of 2. In addition, when the value of d is 2, the pattern generator 111 may generate test patterns to include a diagonal pattern with an interval I of 4. In addition, when the value of d is 3, the pattern generator 111 may generate a test pattern to include diagonal patterns with an interval I of 8.

That is, the pattern generator 111 may generate a pattern including diagonal patterns with intervals corresponding to the second value based on the first value. Here, the first value may be the above-described d, and the second value may be the above-described I. In addition, the first value (e.g., d) may be an exponent of the second value (e.g., I) expressed as a power of 2. That is, I may be $2^d$.

Figure 6:
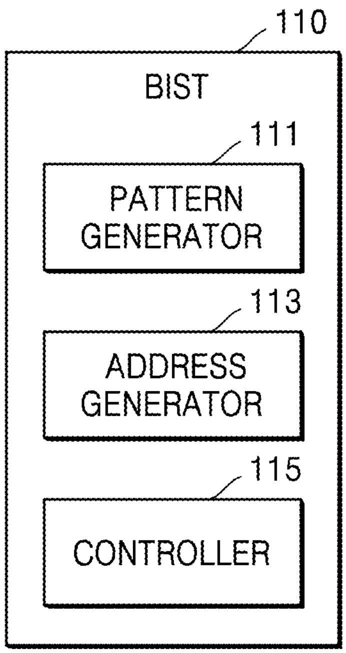
FIG. 6 is a block diagram showing an example of the BIST logic circuit of FIG. 1.

FIG. 6 is a block diagram showing an example of the BIST logic circuit 110 of FIG. 1.

Referring to FIG. 6, the BIST logic circuit 110 may include a pattern generator 111, an address generator 113, and a controller 115.

The address generator 113 may generate address data for memory cells necessary for pattern generation based on the structure of the memory cell array and provide the generated address data to the pattern generator 111. Here, the address data of the memory cell may be a series of bit strings. In addition, address data for one memory cell may include a row address, a column address, and an index INDEX described with reference to FIG. 4 (i.e., location information of a memory partition including the corresponding memory cell).

The pattern generator 111 may designate a bit value for each of the plurality of memory cells based on the address data of each of the plurality of memory cells. That is, the pattern generator 111 may generate a test pattern based on the address data of the memory cell. This is explained in detail with reference to FIG. 7.

The controller 115 may control the overall operation of the BIST logic circuit 110. The controller 115 may be configured to test write and read operations of the memory module 120 by providing the pattern generated by the pattern generator 111 and the address generated by the address generator 113 to the memory module 120.

In addition, the controller 115 may provide the pattern generator 111 with a signal P indicating the inversion of the bit values of memory cells included in all memory partitions, which will be described below, a signal DCE indicating the inversion of the bit values of the memory cells included in the memory partition with an odd index INDEX, which will be described below, a signal representing Mask_00[Z−1:0], which will be described below, a signal representing Mask_AA[Z−1:0], which will be below, and a signal representing Mask_FF[Z−1:0], which will be described below.

Figure 7:
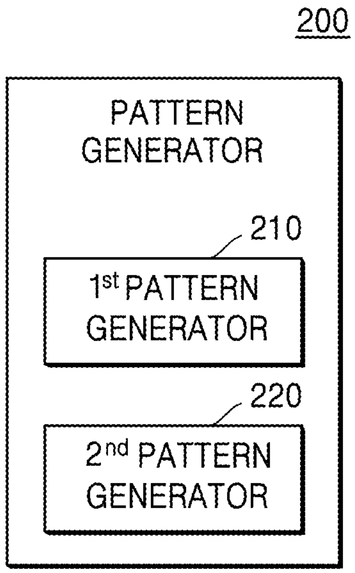
FIG. 7 is a block diagram showing an example of a pattern generator according to an embodiment.

FIG. 7 is a block diagram showing an example of a pattern generator according to an embodiment.

Referring to FIG. 7, the pattern generator 200 may include a first pattern generator 210 and a second pattern generator 220. The first pattern generator 210 may be referred to as a diagonal word M pattern generator, and the second pattern generator 220 may be referred to as a diagonal word W pattern generator.

Word data (e.g., first word data or second word data, etc.) described below may be a series of bit strings. Here, the first word data may be intermediate data for generating the second word data, which is described later. In addition, the second word data may be the word data W (W[Z−1:0]) described with reference to FIG. 4. In addition, the first word data may be referred to as word data M. In addition, the second word data may be referred to as word data W.

The pattern generator 200 may generate a pattern including diagonal patterns with intervals corresponding to the second value based on the first value. Here, the first value may be the above-described d, and the second value may be the above-described I. In addition, the first value (e.g., d) may be an exponent of the second value (e.g., I) expressed as a power of 2. That is, I may be $2^d$.

In detail, the operations of the first pattern generator 210 and the second pattern generator 220 related to the operation of the pattern generator 200 to generate a pattern including diagonal patterns are described.

The first pattern generator 210 may generate the first word data based on the above-described first value (e.g., d) and a third value (e.g., a) that is an exponent of the number of memory cells arranged in the column direction in one memory partition expressed as a power of 2.

That is, the first pattern generator 210 may generate first word data based on an exponent of the value expressed as the power of 2 for the interval I and the exponent of the value expressed as the power of 2 for the number of memory cells arranged in the column direction in the memory partition.

For example, referring to FIGS. 4 and 7, the first pattern generator 210 may generate first word data, M[Z−1:0], based on the value of d and the value of a. Here, d may be the exponent of the interval I expressed as a power of 2, and a may be an index representing the number of memory cells arranged in the column direction in the memory partition as a power of 2.

When the first value (e.g., d) is greater than the third value (e.g. a), the first pattern generator 210 may generate the first word data based on a bit string representing location information of the memory partition and a bit string representing the row address of the memory cell.

For example, when the value of d is greater than the value of a, the first pattern generator 210 may generate first word data, M[Z−1:0], based on Equation 1 below.

$$M[\text{INDEX}] = (\text{INDEX}[d-a-1:0] == XA[d-1:a]) \quad \text{[Equation 1]}$$

Here, INDEX is a value representing the location information of the memory partition, M[INDEX] represents the value of the INDEX-th bit among M[Z−1;0], INDEX[d−a−1:0] may refer to a bit string representing from the value of the 0th bit to the value of the (d−a−1)th bit among all bit strings representing INDEX, and XA[d−1:a] may refer to a bit string representing the value of the a-th bit to the value of the (d−1)th bit among all bit strings representing the column address.

In addition, (A==B) means 1 when the values of A and B are the same, and 0 when the values of A and B are different. That is, in Equation 1, (INDEX[d−a−1:0]==XA[d−1:a]) means 1 when INDEX[d−a−1:0] and XA[d−1:a] are the same, and when INDEX[d−a−1:0] is different from XA[d−1:a], (INDEX[d−a−1:0]==XA[d−1:a]) means 0.

When the first value (e.g., d) is less than or equal to the third value (e.g., a), the first pattern generator 210 may generate first word data such that the values of all bits of the first word data are 1.

For example, when the value of d is less than or equal to the value of a, the first pattern generator 210 may generate first word data, M[Z−1:0], based on Equation 2 below.

$$M[\text{INDEX}]=1 \quad \text{[Equation 2]}$$

Here, INDEX is a value representing the location information of the memory partition, and M[INDEX] may represent the value of the INDEX bit among M[Z−1;0].

The operation of the first pattern generator 210 is described in detail with reference to FIGS. 8A to 8D.

The second pattern generator 220 may generate second word data, W[Z−1:0] based on the first value (e.g., d), first word data, and address condition data.

Here, the second word data may be a basic data unit of an operation of the input/output circuit among a plurality of bit strings included in the test pattern.

That is, the second word data may refer to data per operation of a plurality of input/output circuits that the plurality of input/output circuits input to a plurality of memory partitions so that the bit values of the memory cells included in the memory cell array correspond to the test pattern.

The address condition data may include a relationship between the column address XA of the memory cell and the row address YA of the memory cell.

For example, the address condition data may include a specific relational expression between a bit string representing a row address XA and a bit string representing a column address YA.

For example, the address condition data may include XA[d−1:0]=YA[d−1:0] or XA[a−1:0]=YA[a−1:0]. Here, the XA[d−1:0] may refer to a bit string representing the value of the 0th bit to the d−1th bit among the all bit string representing the row address XA, and the YA[d−1:0] may refer to a bit string representing the value of the 0th bit to the value of the d−1th bit among the all bit string representing the column address YA. In addition, the XA[a−1:0] may refer to a bit string representing the value of the 0th bit to the value of the (a−1)th bit among the all bit string representing the row address XA, and the YA[a−1:0] may refer to a bit string representing the value of the 0th bit to the value of the (a−1)th bit among the all bit string representing the column address YA.

When the first value (e.g., d) is 0, the second pattern generator 220 may generate the second word data such that the second word data is the same as the first word data.

For example, when the value of d is 0, the second pattern generator 220 may generate the second word data W[Z−1:0] so that the second word data W[Z−1:0] is the same as the first word data M[Z−1:0].

That is, when d=0, W[Z−1:0] and M[Z−1:0] may be the same.

When the value of d is greater than 0 and less than the value of a, XA[d−1:0]=YA[d−1:0], the second pattern generator 220 may generate the second word data so that the second word data is the same as the first word data. When the value of d is greater than 0 and less than the value of a, XA[d−1:0]+YA[d−1:0], the second pattern generator 220 may generate the second word data such that the values of all bits of the second word data are 0.

That is, when 0<d<a and XA[d−1:0]=YA[d−1:0], W[Z−1:0] may be the same as M[Z−1:0], and when 0<d<a and XA[d−1:0]≠YA[d−1:0], W[Z−1:0] may be 0.

When the value of d is equal to or greater than the value of a, is equal to or less than the value of b, and XA[a−1:0]=YA[a−1:0], the second pattern generator 220 may generate the second word data so that the second word data is the same as the first word data. When the value of d is equal to or greater than the value of a, equal to or less than the value of b, and XA[a−1:0]=YA[a−1:0], then 1:0], the second pattern generator 220 may generate the second word data such that the values of all bits of the second word data are 0.

That is, when a≤d≤b and XA[a−1:0]=YA[a−1:0], W[Z−1:0] may be the same as M[Z−1:0], and when a≤d≤b and XA[a−1:0]≠YA[a−1:0], the W[Z−1:0] may be 0.

The operation of the second pattern generator 220 is described in detail with reference to FIGS. 9A to 9D.

FIGS. 8A to 8D are diagrams for explaining an operation of a first pattern generator. FIGS. 9A to 9D are diagrams for explaining an operation of a second pattern generator.

In detail, referring to FIG. 4, the parameters of the memory cell array described with reference to FIGS. 8A to 9D are as follows.

The number X of memory cells arranged in the row direction is 10, the number Y of memory cells arranged in the column direction per memory partition is 3, and the number Z of memory partitions is 3, so b is 4 and a is 2 and c is 3.

The case where the value of d is 0 and I is 1 is described with reference to FIGS. 8A and 9A, the case where the value of d is 1 and I is 2 is described with reference to FIGS. 8B and 9B, the case where the value of d is 2 and I is 4 is described with reference to FIGS. 8C and 9C, and the case where the value of d is 3 and I is 8 is described with reference to FIGS. 8D and 9D.

Figure 8A:
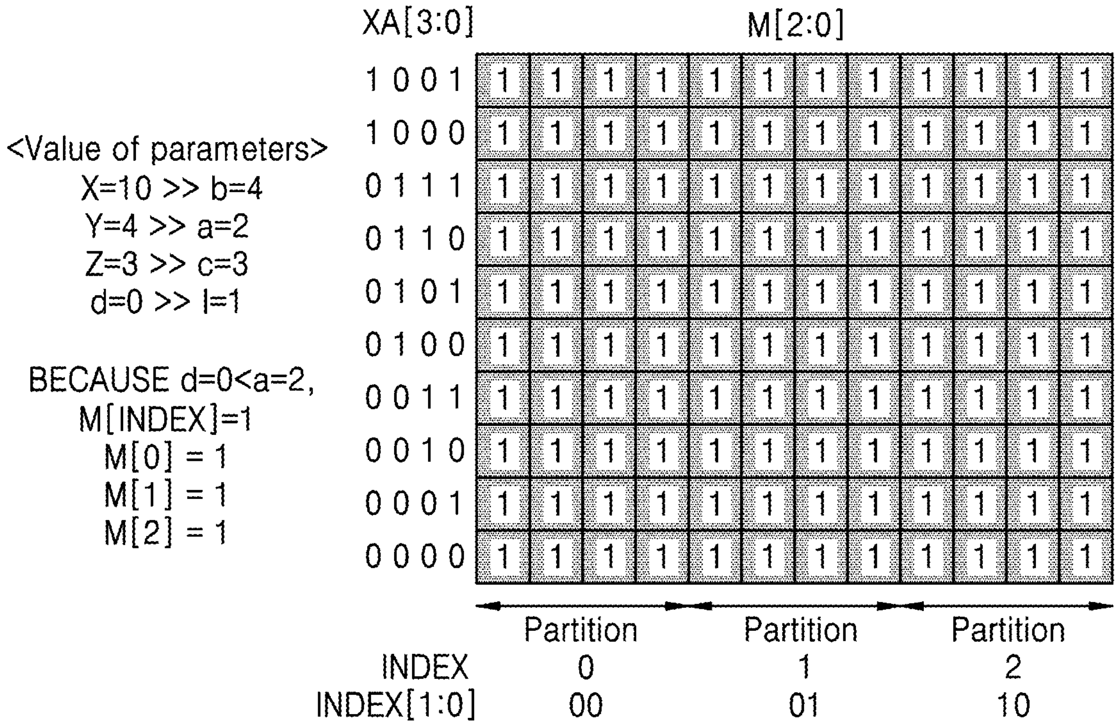
FIGS. 8A to 8D are diagrams for explaining an operation of a first pattern generator.
Figure 9A:
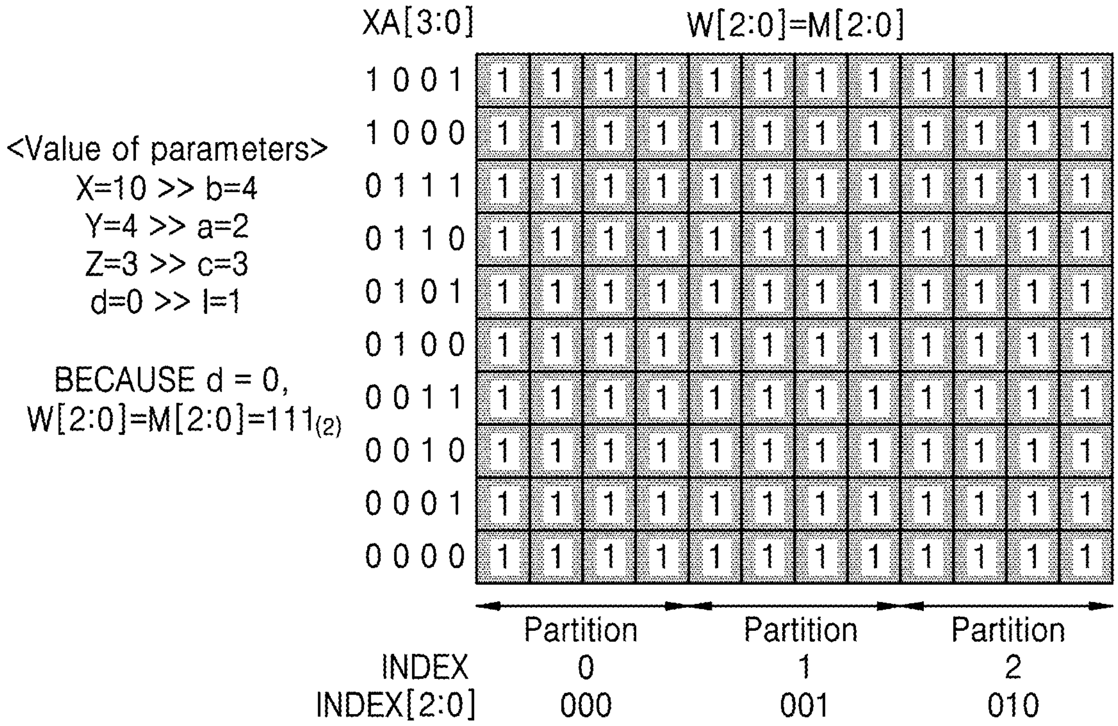
FIGS. 9A to 9D are diagrams for explaining an operation of the second pattern generator.

First, referring to FIGS. 8A and 9A, the case where the value of d is 0 is described.

Referring to FIGS. 4, 7 and 8A, because the value of d is 0 and the value of a is 2, the first pattern generator 210 may generate the first word data M[Z−1:0] based on Equation 2 described above.

That is, because M[INDEX]=1, the first pattern generator 210 may generate a bit string M[Z−1:0] that satisfies M[0]=M[1]=M[2]=1.

Referring to FIGS. 4, 7 and 9A, because the value of d is 0, the second pattern generator 220 may generate the second word data W[Z−1:0] so that the second word data W[Z−1:0] is the same as the first word data M[Z−1:0].

That is, because d=0, W[Z−1:0] is equal to M[Z−1:0]. Accordingly, the second pattern generator 220 may generate a bit string W[Z−1:0] that satisfies W[0]=W[1]=W[2]=1.

Here, W[0]=1 may mean that the value of the bit that the 0th input/output circuit inputs to the 0th memory partition is only 1, W[1]=1 may mean that the value of the bit that the first input/output circuit inputs to the first memory partition is only 1, and W[2]=1 may mean that the value of the bit that the first input/output circuit inputs to the first memory partition is only 1.

Through this, all bit values of memory cells included in the memory cell array shown in FIG. 9A may be designated as 1, and the relationship between the address of such a memory cell and the bit value of the memory cell may be referred to as a pattern having diagonal patterns where the value of the interval I is 1 (the value of d is 0).

Figure 8B:
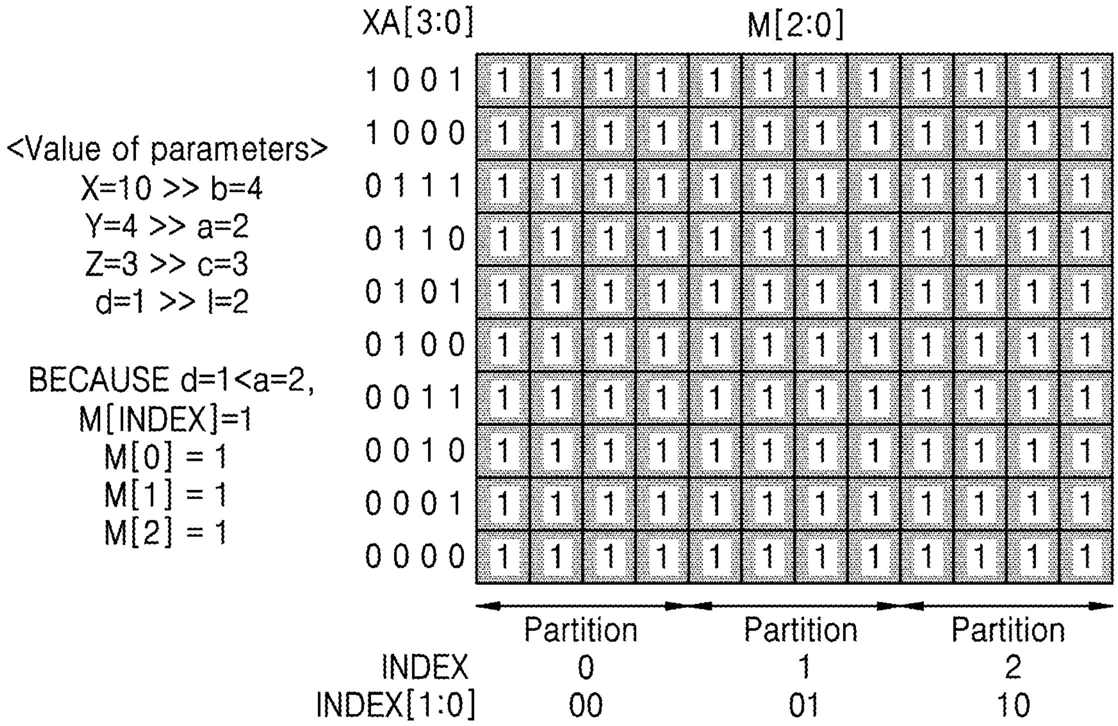
Figure 9B:
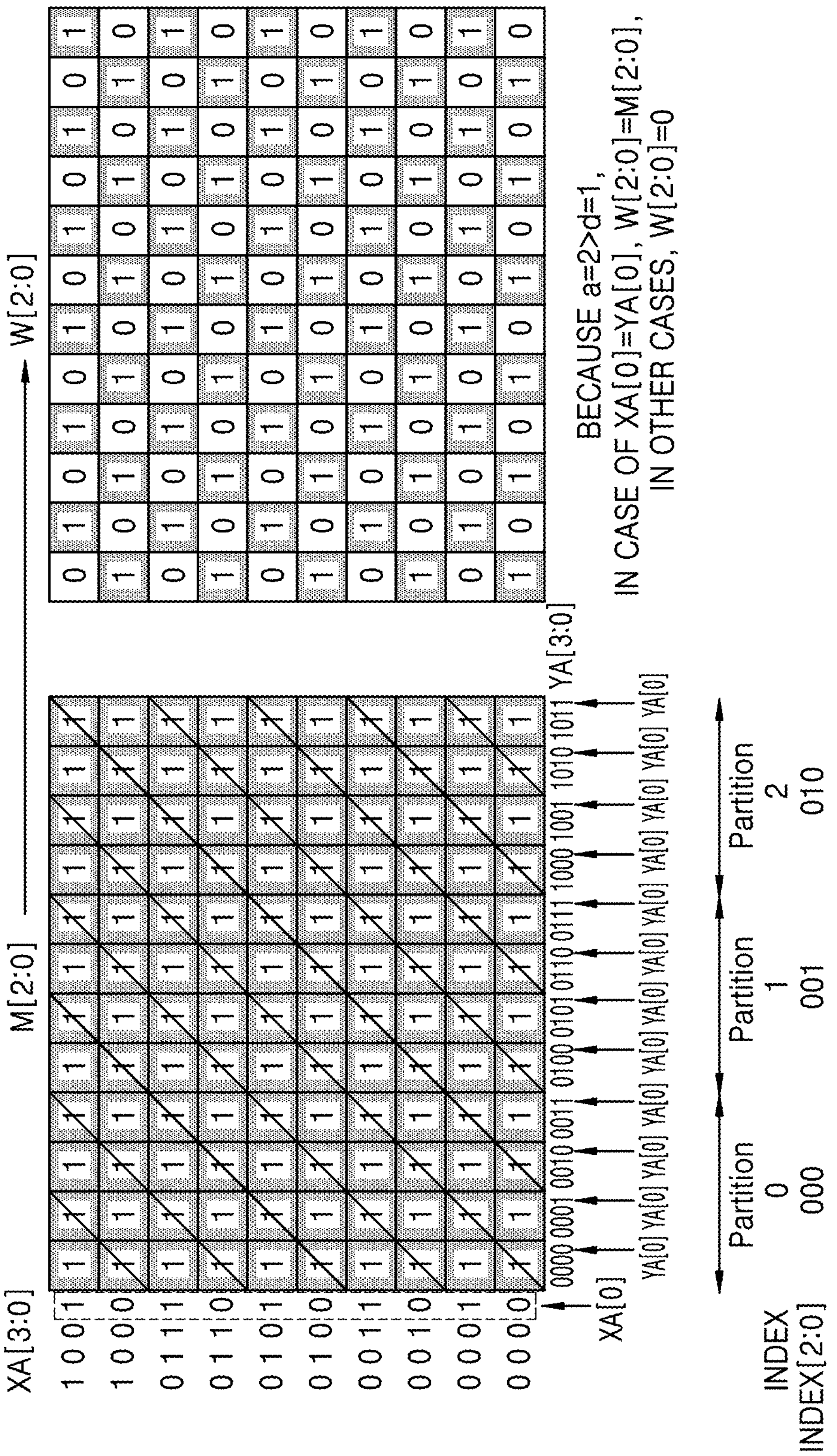

Referring to FIGS. 8B and 9B, the case where the value of d is 1 is described.

Referring to FIGS. 4, 7 and 8B, because the value of d is 1 and the value of a is 2, the first pattern generator 210 may generate first word data M[Z−1:0] based on Equation 2 described above.

That is, because M[INDEX]=1, the first pattern generator 210 may generate a bit string M[Z−1:0] that satisfies M[0]=M[1]=M[2]=1.

Referring to FIGS. 4, 7 and 9B, because the value of d is 1 and less than the value of a, which is 2, the second pattern generator 220 may generate the second word data based on the first address condition data "XA[d−1:0]=YA[d−1:0]".

When "XA[d−1:0]=YA[d−1:0]" is satisfied, the second pattern generator 220 may generate the second word data W[Z−1:0] such that W[Z−1:0], which is the second word data, is the same as M[Z−1:0], which is the first word data. In addition, when XA[d−1:0]=YA[d−1:0] is not satisfied (i.e., XA[d−1:0]≠YA[d−1:0]), the second pattern generator 220 may generate the second word data W[Z−1:0] so that the values of all bits of the second word data W[Z−1:0] are 0.

That is, because d=1, the second pattern generator 220 may generate the second word data W[Z−1:0] so that the second word data W[Z−1:0] is equal to the first word data M[Z−1:0] for memory cells where XA[0]=YA[0]. In addition, the second pattern generator 220 may generate the second word data W[Z−1:0] so that W[Z−1:0]=0 for memory cells where XA[0] ¥YA[0].

Referring to FIG. 9B, it may be seen that a pattern corresponding to M[2:0] and a pattern corresponding to W[2:0] are shown. It may be seen that in the pattern corresponding to M[2:0], memory cells that satisfy XA[0]=YA[0] (i.e., memory cells where the value of the 0th bit of the row address and the value of the 0th bit of the column address are the same) are indicated with diagonal lines. It may be seen that in the pattern corresponding to M[2:0], the bit values of memory cells indicated by diagonal lines are used as is in the pattern corresponding to W[2:0], and in the pattern corresponding to M[2:0], the bit values of memory cells that are not indicated with diagonal lines are designated as 0.

Through this, the bit values of memory cells included in the memory cell array may be specified to repeat 1 and 0, and the relationship between the address of such a memory cell and the bit value of the memory cell may be referred to as a pattern having diagonal patterns where the value of the interval I is 2 (the value of d is 1). Alternatively, this pattern may also be referred to as a checker-board pattern.

Figure 8C:
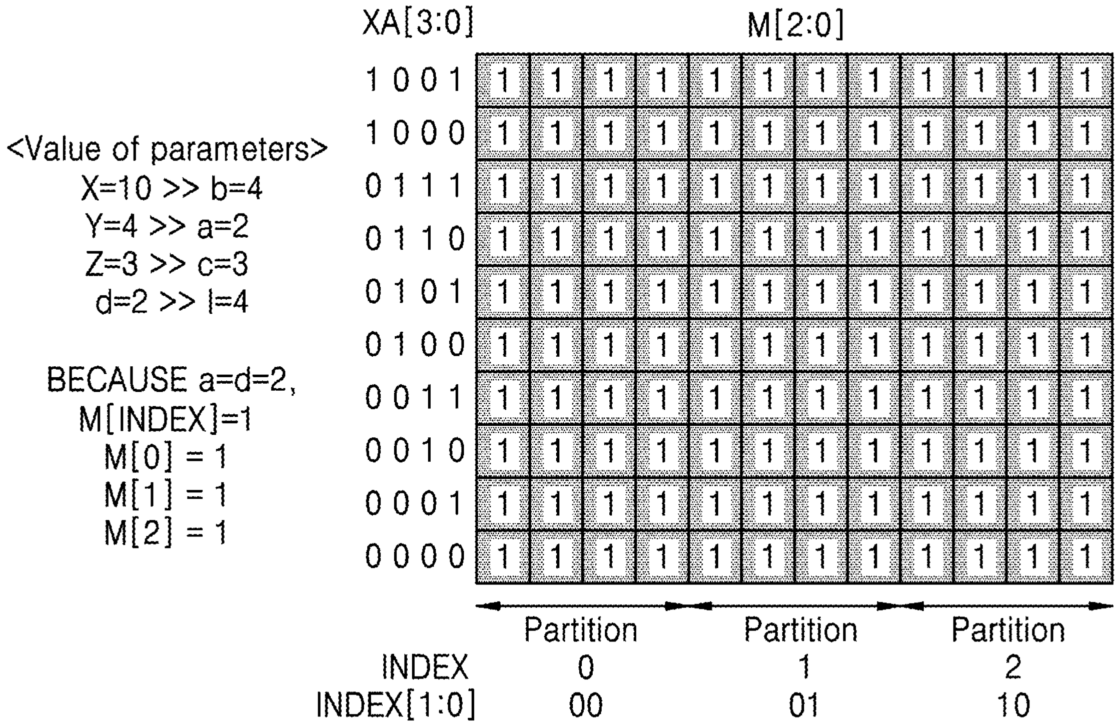
Figure 9C:
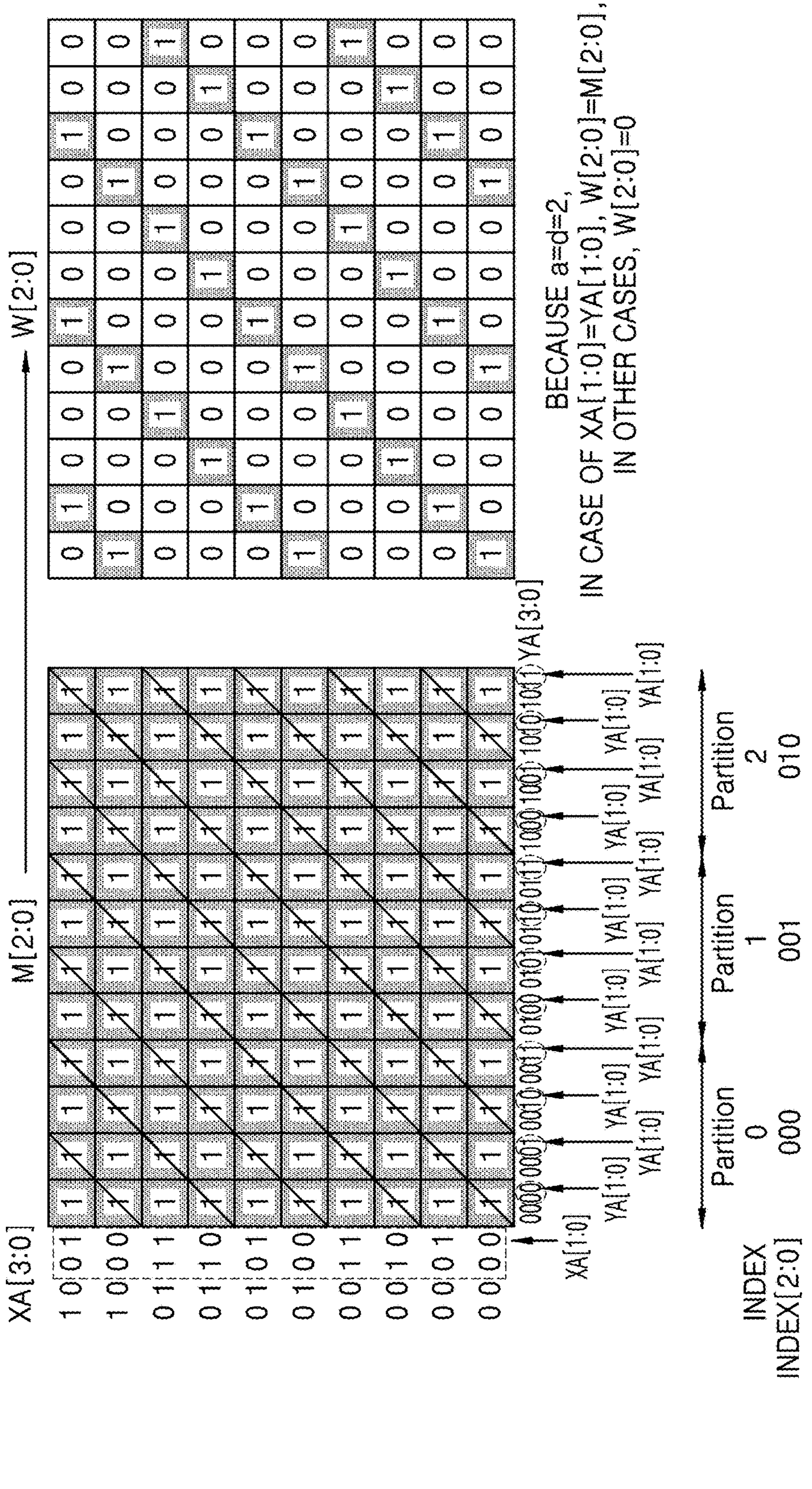

Referring to FIGS. 8C and 9C, the case where the value of d is 2 is described.

Referring to FIGS. 4, 7 and 8C, because the value of d is 2 and the value of a is 2, the first pattern generator 210 may generate the first word data, M[Z−1:0] based on Equation 2 described above.

That is, because M[INDEX]=1, the first pattern generator 210 may generate a bit string M[Z−1:0] that satisfies M[0]=M[1]=M[2]=1.

Referring to FIGS. 4, 7 and 9C, because the value of d is 2 and is equal to the value of a, 2, the second pattern generator 220 may generate second word data based on the second address condition data "XA[a−1:0]=YA[a−1:0]".

When "XA[a−1:0]=YA[a−1:0]" is satisfied, the second pattern generator 220 may generate the second word data W[Z−1:0] so that the second word data W[Z−1:0] is the same as the first word data M[Z−1:0]. In addition, "when XA[a−1:0]=YA[a−1:0] is not satisfied (i.e., XA[a−1:0]≠YA[a−1:0])", the second pattern generator 220 may generate the second word data, W[Z−1:0] so that the values of all bits of the second word data W[Z−1:0] are 0.

That is, because a=d=2, the second pattern generator 220 may generate W[Z−1:0], which is the second word data, so that W[Z−1:0]=M[Z−1:0] for memory cells where XA[1:0]=YA[1:0] and W[Z−1:0]=0 for memory cells where XA[1:0]≠YA[1:0].

Referring to FIG. 9C, it may be seen that a pattern corresponding to M[2:0] and a pattern corresponding to W[2:0] are shown. It may be seen that in the pattern corresponding to M[2:0], memory cells (i.e., memory cells in which the values of the 0th to 1st bits of the row address and the values of the 0th to 1st bits of the column address are the same) that satisfy XA[1:0]=YA[1:0] are indicated with diagonal lines. It may be seen that in the pattern corresponding to M[2:0], the bit values of memory cells indicated by diagonal lines are used as is in the pattern corresponding to W[2:0], and in the pattern corresponding to M[2:0], the bit values of memory cells that are not indicated with diagonal lines are designated as 0.

Through this, the bit values of memory cells included in the memory cell array may be specified as shown in FIG. 9C, and the pattern shown in FIG. 9C may be referred to as a pattern having diagonal patterns with an interval I of 4 (the value of d is 2).

Figure 8D:
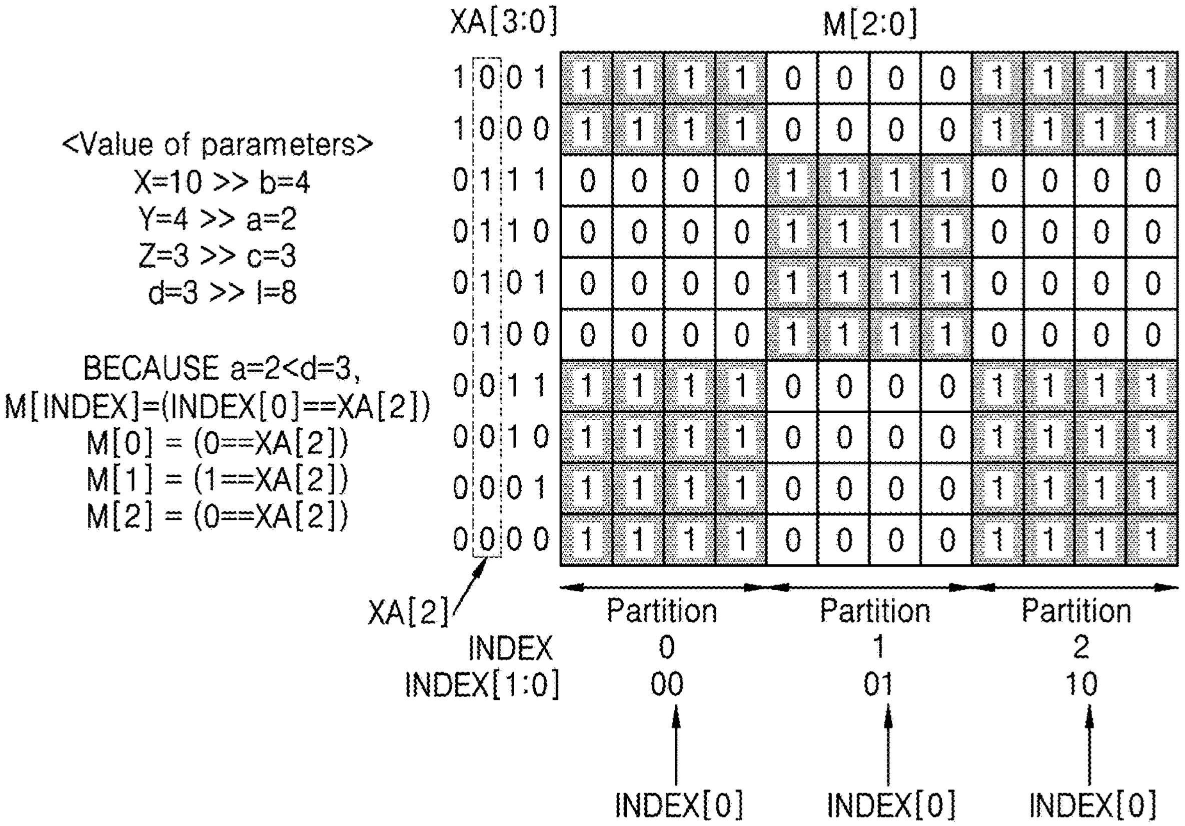
Figure 9D:
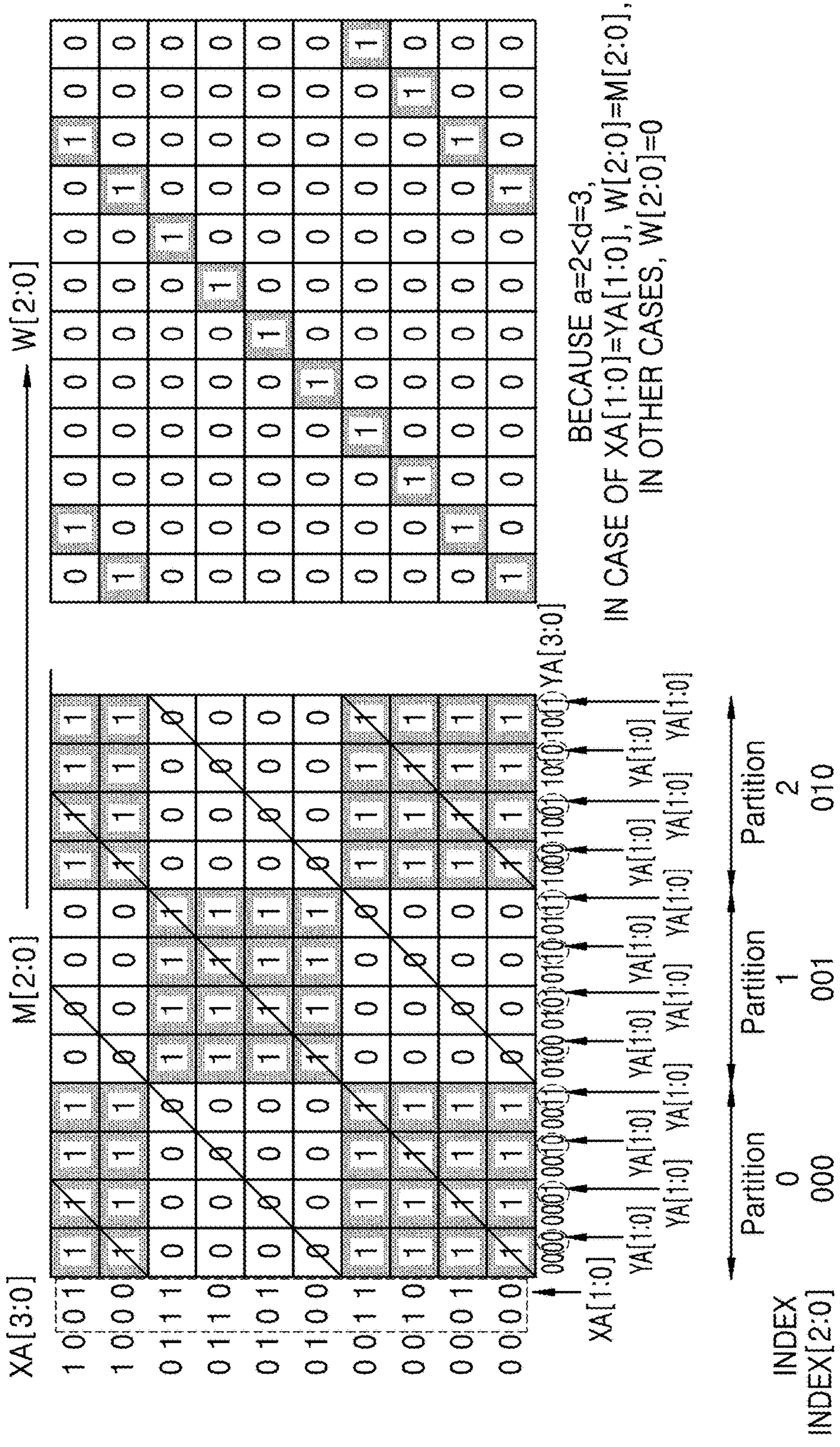

Referring to FIGS. 8D and 9D, the case where the value of d is 3 is described.

Referring to FIGS. 4, 7 and 8D, because the value of d is 3 and the value of a is 2, the first pattern generator 210 may generate first word data, M[Z−1:0], based on Equation 1 described above.

That is, because M[INDEX]=(INDEX[0]==XA[2]), the first pattern generator 210 may generate a bit string M[2:0] that satisfies M[0]=(0==XA[2]), M[1]=(1==XA[2]), and M[2]=(0==XA[2])]). Here, INDEX is one of the values (e.g., 0, 1, 2) indicating the location information of the memory partition, INDEX[0] means the value of the 0th bit of the bit string representing INDEX (e.g., 0, 1, 2), and XA[2] represents the value of the second bit in the bit string representing the column address.

Referring to FIG. 8D, it may be seen that the pattern corresponding to the bit string M[2:0] that satisfies M[0]=(0==XA[2]), M[1]=(1==XA[2]), and M[2]=(0==XA[2]) is shown. It may be seen that when INDEX is 0, INDEX[0] represents 0, when INDEX is 1, INDEX[0] represents 1, and when INDEX is 2, INDEX[0] represents 1. In addition, (0==XA[2]) means 1 when XA[2] is equal to 0, and 0 when XA[2] is different from 0. (1==XA[2]) means 1 when XA[2] is equal to 1, and 0 when XA[2] is different from 1.

M[0]=(0==XA[2]) means that the bit value assigned to the memory cell in which the second bit value of the bit string representing the column address is 0 among the memory cells included in the 0th memory partition is 1. M[1]=(1==XA[2]) means that the bit value assigned to the memory cell in which the second bit value of the bit string representing the column address is 1 among the memory cells included in the first memory partition is 1. M[2]=(0==XA[2]) means that the bit value assigned to the memory cell in which the second bit value of the bit string representing the column address is 1 among the memory cells included in the second memory partition is 1.

Referring to FIGS. 4, 7 and 9D, because the value of d is 3 and is greater than the value of a, which is 2, the second pattern generator 220 may generate the second word data based on the second address condition data "XA[a−1:0]=YA[a−1:0]".

When "XA[a−1:0]=YA[a−1:0]" is satisfied, the second pattern generator 220 may generate the second word data W[Z−1:0] so that the second word data W[Z−1:0] is the same as the first word data M[Z−1:0]. In addition, "when XA[a−1:0]=YA[a−1:0] is not satisfied (i.e., XA[a−1:0]≠YA[a−1:0])", the second pattern generator 220 may generate the second word data W[Z−1:0] so that the values of all bits of the second word data W[Z−1:0] are 0.

That is, because d=3 and a=2, the second pattern generator 220 may generate second word data W[Z−1:0] so that W[Z−1:0]=M[Z−1:0] for memory cells where XA[1:0]=YA[1:0]. In addition, the second pattern generator 220 may generate second word data, W[Z−1:0] so that W[Z−1:0]=0 for the memory cells where XA[1:0]+YA[1:0].

Referring to FIG. 9D, it may be seen that a pattern corresponding to M[2:0] and a pattern corresponding to W[2:0] are shown. It may be seen that in the pattern corresponding to M[2:0], memory cells (i.e., memory cells in which the values of the 0th to 1st bits of the row address and the values of the 0th to 1st bits of the column address are the same) that satisfy XA[1:0]=YA[1:0] are indicated with diagonal lines. It may be seen that in the pattern corresponding to M[2:0], the bit values of memory cells indicated by diagonal lines are used as is in the pattern corresponding to W[2:0], and in the pattern corresponding to M[2:0], the bit values of memory cells that are not indicated with diagonal lines are designated as 0.

Through this, the bit values of memory cells included in the memory cell array may be specified as shown in FIG. 9D, and the pattern shown in FIG. 9D may be referred to as a pattern having diagonal patterns with an interval I of 8 (the value of d is 3).

Figure 10:
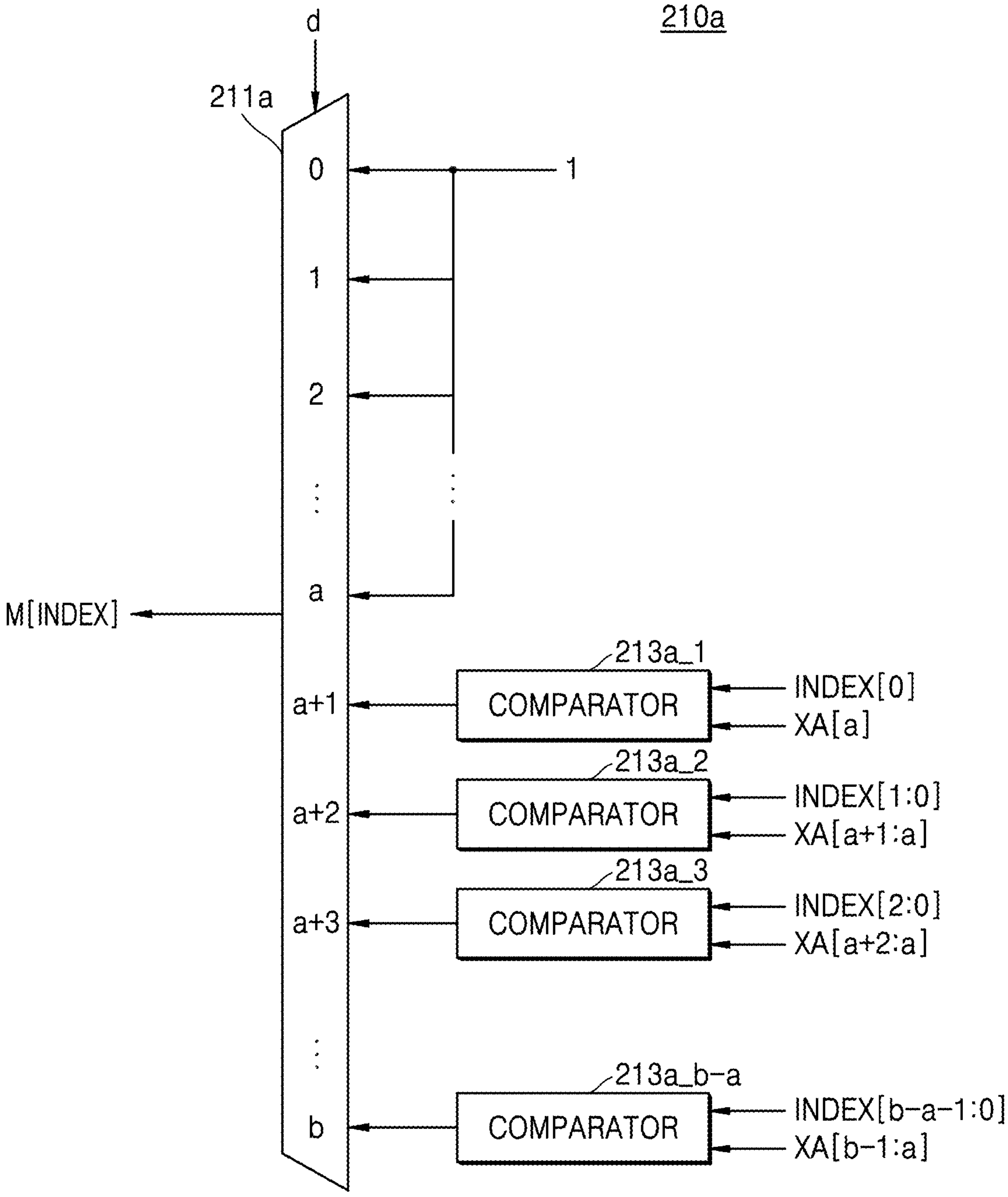
FIG. 10 is a block diagram illustrating a first pattern generator according to an embodiment.

FIG. 10 is a block diagram illustrating a first pattern generator according to an embodiment.

Referring to FIG. 10, a first pattern generator 210*a* may include a multiplexer 211*a* and a plurality of comparators 213*a*_1 to 213*a*_*b*−*a*.

The multiplexer 211*a* may output a signal representing M[INDEX], which is the value of the INDEX bit among M[Z−1:0], which is the first word data, based on the value of the first value (e.g., d).

Referring to FIG. 10, when the value of d is greater than or equal to 0 and less than or equal to a, the multiplexer 211*a* may output a signal indicating 1. That is, in this case, M[INDEX]=1.

Referring to FIG. 10, when the value of d is greater than a and less than or equal to b, the multiplexer 211*a* may output a signal representing the output value of one of the plurality of comparators 213*a*_1 to 213*a*_*b*−*a*. That is, in this case, M[INDEX]=(INDEX[d−a−1:0]==XA[d−1:a]).

For example, when the value of d is a+1, the multiplexer 211*a* may output the output value of the first comparator 213*a*_1. In this case, the first comparator 213*a*_1 compares INDEX[0] with XA[a], and then the output value of the first comparator 213*a*_1 may be 1 when the INDEX[0] is equal to the XA[a], and 0 when the INDEX[0] is different from the XA[a]. In addition, when the value of d is a+2, the multiplexer 211*a* may output the output value of the second comparator 213*a*_2. In this case, the output value of the second comparator 213*a*_2 compares INDEX[1:0] with XA[a+1:a], and then may be 1 when the INDEX[1:0] is equal to the XA[a+1:a], and 0 when the INDEX[1:0] is different from the XA[a+1:a]. In addition, when the value of d is a+3, the multiplexer 211*a* may output the output value of the third comparator 213*a*_3. In this case, the third comparator 213*a*_3 compares INDEX[2:0] with XA[a+2:a], and then the output value of the third comparator 213*a*_3 may be 1 when the INDEX[2:0] is equal to the XA[a+2:a], and 0 when the INDEX[2:0] is different from the XA[a+2:a]. In addition, when the value of d is b, the multiplexer 211*a* may output the output value of the b−a comparator 213*a*_b−a. In this case, the b−a comparator 213*a*_b−a compares INDEX[b−a−1:0] with XA[b−1:a], and then the output value of the b−a comparator 213*a*_b−a may be 1 when the INDEX[b−a−1:0] is equal to the XA[b−1:a], and 0 when the INDEX[b−a−1:0] is different from the XA[b−1:a].

Figure 11A:
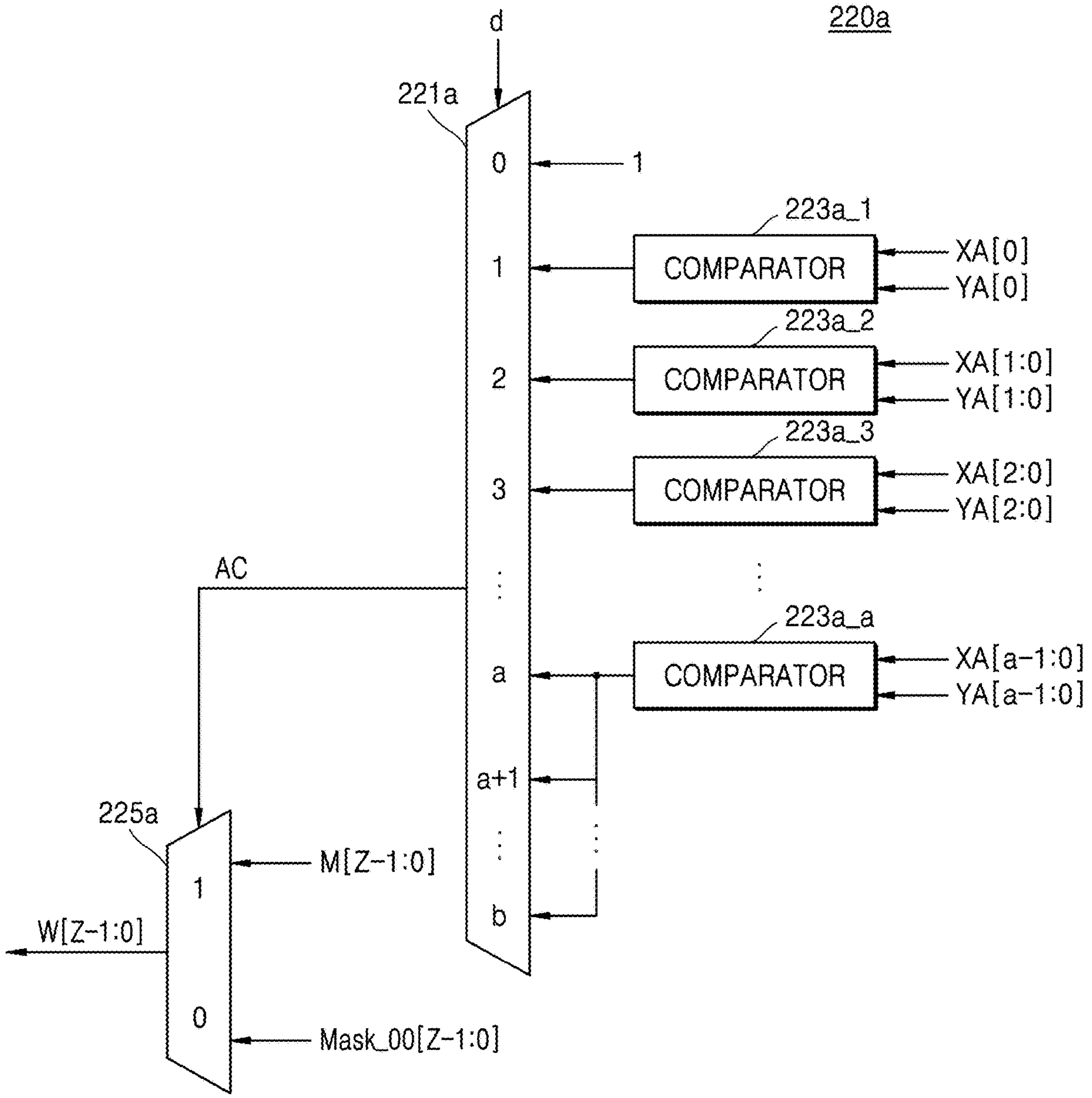
FIGS. 11A to 11C and 11E are block diagrams illustrating a second pattern generator according to an embodiment.

FIG. 11A is a block diagram illustrating a second pattern generator according to an embodiment.

Referring to FIG. 11A, a second pattern generator 220*a* may include a first multiplexer 221*a*, a plurality of comparators 223*a*_1 to 223*a*_*a*, and a second multiplexer 225*a*.

The first multiplexer 221*a* may output a signal AC representing address condition data based on the first value (e.g., d). Here, when XA[d−1:0]=YA[d−1:0] or XA[a−1:0]=YA[a−1:0] is satisfied, the signal AC representing the address condition data has a value of 1. Additionally, when the value of d is 0, the signal AC may have a value of 1, and in other cases, the signal AC may have a value of 0.

Referring to FIG. 11A, when the value of d is 0, the first multiplexer 221*a* may output a signal indicating 1.

Referring to FIG. 11A, when the value of d is greater than 0, the first multiplexer 221*a* may output a signal representing the output value of one of the plurality of comparators 223*a*_1 to 223*a*_*a*.

When the value of d is greater than 0 and is equal to or less than the value of a, the first multiplexer 221*a* may output a signal representing (XA[d−1:0]==YA[d−1:0]), which is an output value of one of the plurality of comparators 223*a*_1 to 223*a*_*a*.

For example, when the value of d is 1, the first multiplexer 221*a* may output the output value of the first comparator 223*a*_1. In this case, the first comparator 223*a*_1 compares XA[0] with YA[0], and then the output value of the first comparator 223*a*_1 may be 1 when the XA[0] is equal to the YA[0] and 0 when the XA[0] is different from the YA[0]. In addition, when the value of d is 2, the first multiplexer 221*a* may output the output value of the second comparator 223*a*_2. In this case, the second comparator 223*a*_2 compares XA[1:0] with YA[1:0], and then the output value of the second comparator 223*a*_2 may be 1 when the XA[1:0] is equal to the YA[1:0], and 0 when the XA[1:0] is different from the YA[1:0]. In addition, when the value of d is 3, the first multiplexer 221*a* may output the output value of the third comparator 223*a*_3. In this case, the output value of the third comparator 223*a*_3 compares XA[1:0] with YA[1:0], and then the output value of the third comparator 223*a*_3 may be 1 when the XA[1:0] is equal to the YA[1:0], and 0 when the XA[1:0] is different from the YA[1:0]. In addition, when the value of d is a, the first multiplexer 221*a* may output the output value of an a-th comparator 223*a*_3. In this case, the a-th comparator 223*a_a* compares XA[a−1:0] with YA[a−1:0], and then the output value of the a-th comparator 223*a_a* may be 1 when the XA[a−1:0] is equal to the YA[a−1:0], and 0 when the XA[a−1:0] is different from the YA[a−1:0].

When the value of d is greater than the value of a, the first multiplexer 221*a* may output a signal representing (XA[a−1:0]==YA[a−1:0]), which is the output value of the a-th comparator.

For example, when the value of d is a+1, the first multiplexer 221*a* may output the output value of the a-th comparator 223*a_a*. In this case, the a comparator 223*a*_1 compares XA[a−1:0] with YA[a−1:0], and then the output value of the a-th comparator 223*a*_1 may be 1 when XA[a−1:0] is equal to the YA[a−1:0] and 0 when the XA[a−1:0] is different from the YA[a−1:0]. In addition, when the value of d is b, the first multiplexer 221*a* may output the output value of the a-th comparator 223*a_a*. In this case, the a comparator 223*a*_1 compares XA[a−1:0] with YA[a−1:0], and then the output value of the a-th comparator 223*a*_1 may be 1 when the XA[a−1:0] is equal to the YA[a−1:0], and 0 when the XA[a−1:0] is different from the YA[a−1:0].

The second multiplexer 225*a* may output the second word data W[Z−1:0] based on the value of the signal AC representing the address condition data.

Referring to FIG. 11A, when the value of the signal AC representing the address condition data is 0, the second multiplexer 225*a* may output a signal representing Mask_00 [Z−1:0] as the second word data, W[Z−1:0]. Here, Mask_00 [Z−1:0] may mean a bit string consisting of Z bits and in which the value of all bits is 0.

Referring to FIG. 11A, when the value of the signal AC representing the address condition data is 1, the second multiplexer 225*a* may output a signal representing M[Z−1:0], which is first word data, as W[Z−1:0], which is the second word data.

In this case, the second pattern generator 220*b* may be configured to provide the second word data, W1[Z−1:0] to a plurality of input/output circuits.

Figure 11B:
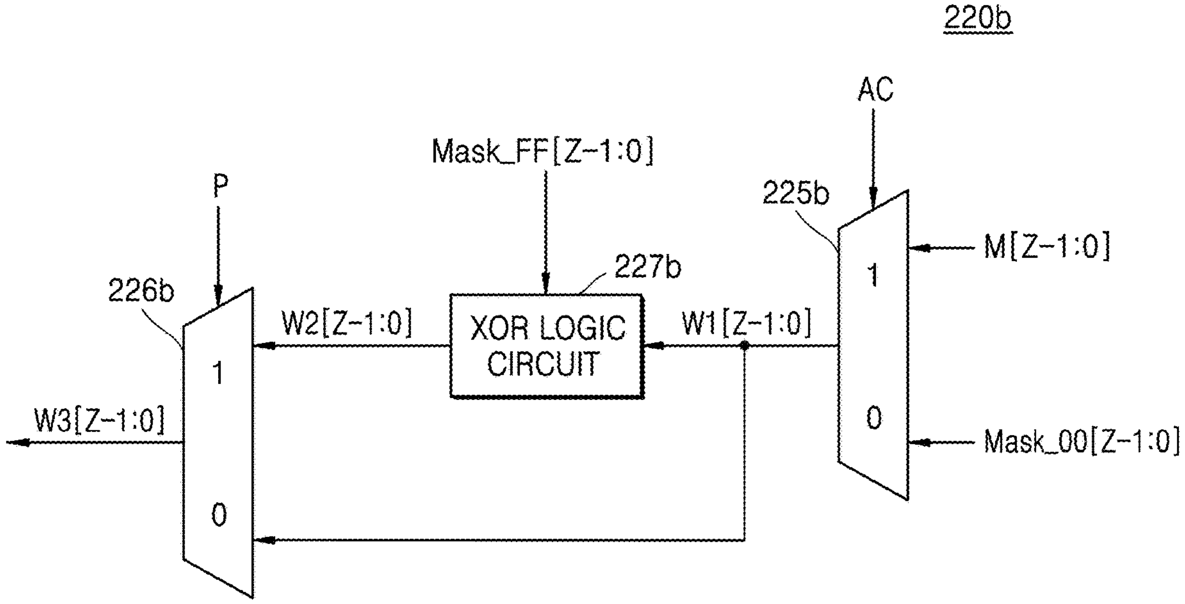

FIG. 11B is a block diagram illustrating a second pattern generator according to an embodiment.

Referring to FIG. 11B, a second pattern generator 220*b* may include a second multiplexer 225*b*, a third multiplexer 226*b*, and a first XOR logic circuit 227*b*. The second multiplexer 225*b* may correspond to the second multiplexer 225*a* described with reference to FIG. 11A, and the description already given is omitted. In addition, although not shown in FIG. 11B, the second pattern generator 220*b* may further include a first multiplexer that outputs a signal AC representing address condition data, and the description of the first multiplexer is replaced with the description of the first multiplexer 221*a* described with reference to FIG. 11A.

Referring to FIG. 11B, as described with reference to FIG. 11A, the second multiplexer 225*b* may output the second word data W1[Z−1:0] based on the value of the signal AC representing the address condition data.

The third multiplexer 226*b* may output fourth word data W3[Z−1:0] based on a signal P indicating the inversion of the bit values of memory cells included in all memory partitions.

In detail, the third multiplexer 226*b* may output the second word data, W1[Z−1:0], as fourth word data, W3[Z−1:0], or output third word data, W1[Z−1:0] in which all bit values of W1[Z−1:0], which is the second word data, are inverted, as the fourth word data, W3[Z−1:0]. Here, inverting the bit value may mean that the bit value of the memory cell designated as 0 is changed to 1, and the bit value of the memory cell designated as 1 is changed to 0.

For example, referring to FIG. 11B, when the value of the signal P is 1, the third multiplexer 226*b* may output W2[Z−1:0], which is the third word data, as W3[Z−1:0], which is the fourth word data. In addition, when the value of the signal P is 0, the third multiplexer 226*b* may output W1[Z−1:0], which is the second word data, as W3[Z−1:0], which is the fourth word data.

The first XOR logic circuit 227*b* may receive W1[Z−1:0], which is second word data, as an input value. In addition, the first XOR logic circuit 227*b* may output the inverted third word data W2[Z−1:0], which is all bit values of the second word data W1[Z−1:0], as an output value.

The first XOR logic circuit 227*b* may additionally receive a signal representing Mask_FF[Z−1:0]. Here, Mask_FF[Z−1:0] may mean a bit string consisting of Z bits and in which the value of all bits is 1.

In addition, the first XOR logic circuit 227*b* may perform an XOR operation on Mask_FF[Z−1:0] and W1[Z−1:0], which is the second word data, and output W2[Z−1:0], which is the third word data. For example, because values of the XOR operation between the bit strings of 11 and the bit strings of 00, 01, 10, and 11 are 11, 10, 01, and 00, respectively, it may be determined that all bit values in the bit string (00, 01, 10, 11) are inverted.

Moreover, the second pattern generator 220*b* may be configured to provide W3[Z−1:0], which is the fourth word data, instead of W1[Z−1:0], which is the second word data, to a plurality of input/output circuits.

Through this, the second pattern generator 220*b* may selectively generate a pattern corresponding to W1[Z−1:0], which is the second word data, and a pattern corresponding to W2[Z−1:0], which is the third word data in which all bit values of the second word data are inverted.

In addition, the bit values of the above-described diagonal patterns were assumed to be 1, but the second pattern generator 220*b* may generate a pattern such that the bit values of the diagonal patterns are 0 through Mask_FF[Z−1:0] and the first XOR logic circuit 227*b*.

Figure 11C:
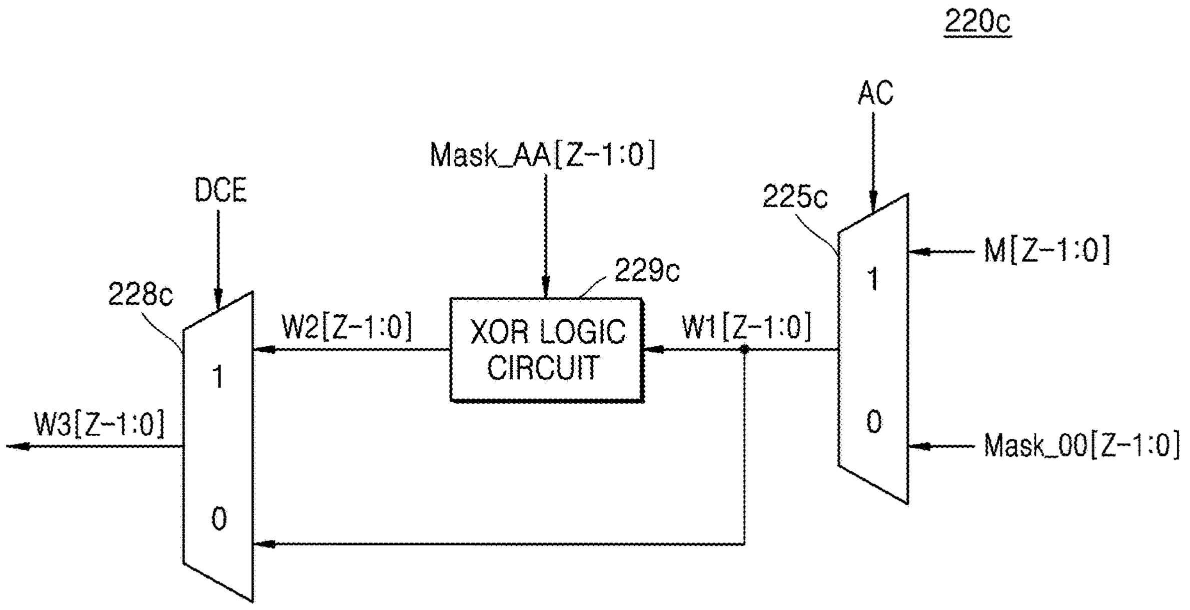

FIG. 11C is a block diagram illustrating a second pattern generator according to an embodiment.

Referring to FIG. 11C, the second pattern generator 220*c* may include a second multiplexer 225*c*, a fourth multiplexer 228*c*, and a second XOR logic circuit 229*b*. The second multiplexer 225*c* may correspond to the second multiplexer 225*a* described with reference to FIG. 11A, and the description already given is omitted. In addition, although not shown in FIG. 11C, the second pattern generator 220*c* may further include a first multiplexer that outputs a signal AC representing address condition data, and the description of the first multiplexer is replaced with the description of the first multiplexer 221*a* described with reference to FIG. 11A.

Referring to FIG. 11C, as described with reference to FIG. 11A, the second multiplexer 225*c* may output the second word data W1[Z−1:0] based on the value of the signal AC representing address condition data.

The fourth multiplexer 228*c* may output fourth word data W3[Z−1:0] based on the signal DCE indicating the inversion of bit values of memory cells included in a memory partition with an odd index.

In detail, the fourth multiplexer 228*c* may output W1[Z−1:0], which is the second word data, as W3[Z−1:0], which is fourth word data, or output W2[Z−1:0], which is third word data in which the bit values of memory cells included in the memory partition where the index of the second word data W2[Z−1:0] is odd, are inverted, as fourth word data W3[Z−1:0]. Here, inverting the bit value may mean that the bit value of the memory cell designated as 0 is changed to 1, and the bit value of the memory cell designated as 1 is changed to 0.

For example, referring to FIG. 11C, when the value of the signal DCE is 1, the fourth multiplexer 228*c* may output W2[Z−1:0], which is the third word data, as W3[Z−1:0], which is the fourth word data. In addition, when the value of the signal DCE is 0, the fourth multiplexer 228*c* may output the second word data, W1[Z−1:0], as the fourth word data, W3[Z−1:0].

The second XOR logic circuit 229*c* may receive W1[Z−1:0], which is the second word data, as an input value. In addition, the second XOR logic circuit 229*c* may output W2[Z−1:0], which is the third word data, in which bit values of memory cells included in a memory partition where the index of the second word data, W1[Z−1:0] is odd are inverted as an output value.

The second XOR logic circuit 229*c* may additionally receive a signal representing Mask_AA[Z−1:0]. Here, Mask_AA[Z−1:0] may refer to a bit string that consists of Z bits and the bit string 10 being repeated Z/2 times. For example, Mask_AA[3:0] may be 1010.

In addition, the second XOR logic circuit 229*c* may perform an XOR operation on Mask_AA[Z−1:0] and the second word data W1[Z−1:0] to output the third word data W2[Z−1:0]. For example, because the values of the XOR operation between the bit strings of 10 and the bit strings of 00, 01, 10, and 11 are 10, 11, 00, and 01, respectively, it may be seen that the bit value of the first bit of the bit string (00, 01, 10, 11) is inverted.

Moreover, the second pattern generator 220*b* may be configured to provide fourth word data W3[Z−1:0] instead of second word data W1[Z−1:0] to a plurality of input/output circuits.

That is, the second pattern generator 220*c* may generate the third word data W2[Z−1:0] by inverting the values of odd bits of second word data W1[Z−1:0] and may be configured to provide the third word data W2[Z−1:0] instead of second word data W1[Z−1:0] to the plurality of input/output circuits.

Through this, the second pattern generator 220*c* may selectively generate one of a pattern corresponding to the second word data W1[Z−1:0] and a pattern corresponding to the third word data W2[Z−1:0] in which the bit values of the memory cells included in a memory partition with an odd index are inverted compared to the second word data W1[Z−1:0].

The second pattern generator 220*c* may generate a pattern such that the pattern corresponding to the memory partition with an odd index INDEX is different from the pattern corresponding to the memory partition with an even index INDEX, through Mask_AA[Z−1:0] and the second XOR logic circuit 229*c*. For example, the second pattern generator 220*c* may generate a pattern such as the pattern shown in FIG. 11D.

Figure 11D:
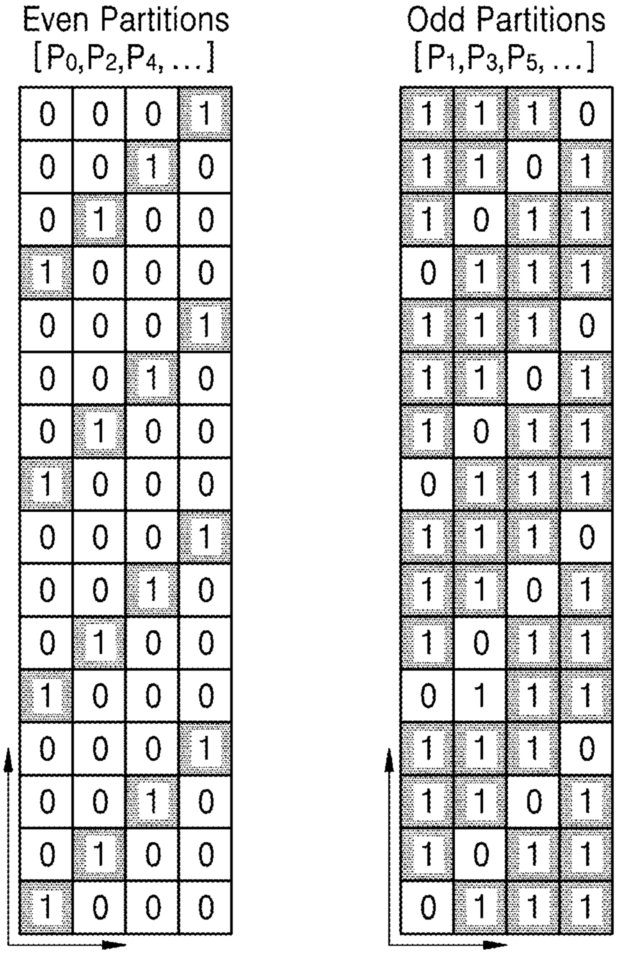
FIG. 11D is a block diagram illustrating a pattern generated by a second pattern generator according to an embodiment according to FIG. 11C.

FIG. 11*d* is a block diagram illustrating a pattern by the second pattern generator 220*c* according to an embodiment. Referring to FIG. 11D, in a memory partition where the index is an even number, the value of the interval I of the diagonal patterns may be 4 and the bit value of the diagonal patterns may be 1. In a memory partition with an odd index, the value of the interval I of the diagonal patterns may be 4 and the bit value of the diagonal patterns may be 0. This pattern may be referred to as a diagonal checker-board pattern.

Figure 11E:
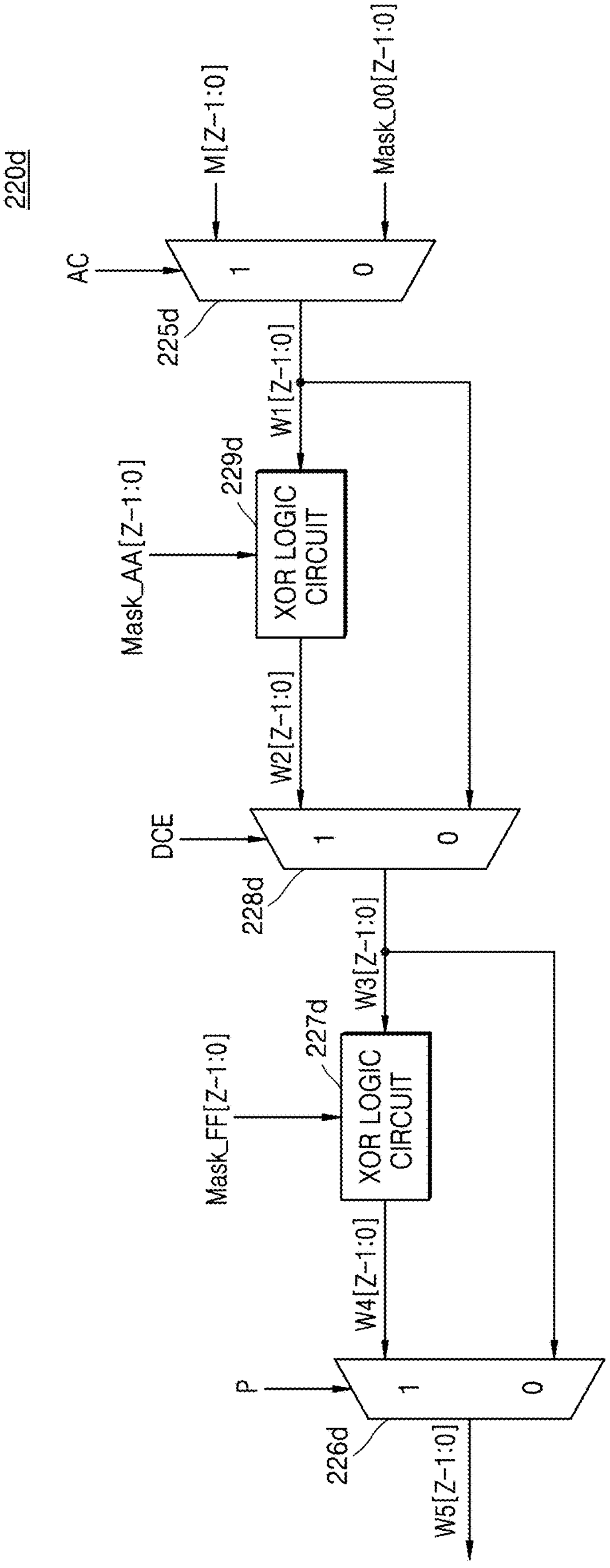

FIG. 11E is a block diagram illustrating a second pattern generator according to an embodiment.

Referring to FIG. 11E, the second pattern generator 220*d* may include a second multiplexer 225*d*, a third multiplexer 226*d*, a first XOR logic circuit 227*d*, a fourth multiplexer 228*d*, and a second XOR logic circuit 229*d*. The second multiplexer 225*d* may correspond to the second multiplexer 225*a* described with reference to FIG. 11A, the third multiplexer 226*d* and the first XOR logic circuit 227*d* may correspond to the third multiplexer 226*b* and the first XOR logic circuit 227*b* described with reference to FIG. 11B, the fourth multiplexer 228*d* and the second XOR logic circuit 229*d* may correspond to the fourth multiplexer 228*c* and the second XOR logic circuit 229*c* described with reference to FIG. 11C, and the description already given is omitted. Here, the positions of the fourth multiplexer 228*d* and the second XOR logic circuit 229*d* may be interchanged with the positions of the third multiplexer 226*d* and the first XOR logic circuit 227*d*. In addition, although not shown in FIG. 11E, the second pattern generator 220*d* may further include a first multiplexer that outputs a signal AC representing address condition data, and the description of the first multiplexer is replaced with the description of the first multiplexer 221*a* described with reference to FIG. 11A.

Referring to FIG. 11E, as described with reference to FIG. 11A, the second multiplexer 225*d* may output the second word data, W1[Z−1:0] based on the value of the signal AC representing address condition data.

The fourth multiplexer 228*d* may output fourth word data W3[Z−1:0] based on the signal DCE indicating the inversion of bit values of memory cells included in a memory partition with an odd index.

In detail, the fourth multiplexer 228*d* may output W1[Z−1:0], which is the second word data, as W3[Z−1:0], which is fourth word data, or output W2[Z−1:0], which is third word data in which the bit values of memory cells included in the memory partition where the index of the second word data W2[Z−1:0] is odd, are inverted, as fourth word data W3[Z−1:0]. Here, inverting the bit value may mean that the bit value of the memory cell designated as 0 is changed to 1, and the bit value of the memory cell designated as 1 is changed to 0.

For example, referring to FIG. 11E, when the value of signal DCE is 1, the fourth multiplexer 228*d* may output W2[Z−1:0], which is third word data, as W3[Z−1:0], which is fourth word data. In addition, when the value of signal DCE is 0, the fourth multiplexer 228*d* may output W1[Z−1:0], which is the second word data, as W3[Z−1:0], which is fourth word data.

The third multiplexer 226*d* may output sixth word data W5[Z−1:0] based on the signal P indicating the inversion of the bit values of memory cells included in all memory partitions.

In detail, the multiplexer 226*d* may output W3[Z−1:0], which is the fourth word data, as W5[Z−1:0], which is the sixth word data, or output the W4 [Z−1:0], which is the fifth word data, in which all bit values of the fourth word data, W3[Z−1:0], are inverted as W5[Z−1:0], which is the sixth word data. Here, inverting the bit value may mean that the bit value of the memory cell designated as 0 is changed to 1, and the bit value of the memory cell designated as 1 is changed to 0.

For example, referring to FIG. 11E, when the value of the signal P is 1, the third multiplexer 226*d* may output W4 [Z−1:0], which is the fifth word data, as W5[Z−1:0], which is the sixth word data. In addition, when the value of the signal P is 0, the third multiplexer 226*d* may output W3[Z−1:0], which is the fourth word data, as W5[Z−1:0], which is the sixth word data.

Moreover, the second pattern generator 220*e* may be configured to provide the sixth word data W5[Z−1:0] instead of the second word data W1[Z−1:0] to the plurality of input/output circuits.

Through this, according to an embodiment, in addition to generating a pattern with a diagonal interval corresponding to the second value (e.g., I) based on the first value (e.g., d), there is an effect of generating various patterns by controlling the signal P and the signal DCE.

Figure 12A:
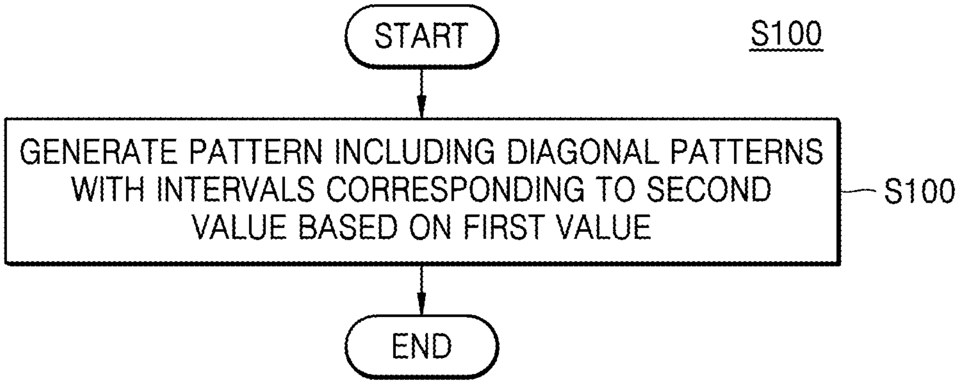
FIGS. 12A and 12B are flowcharts explaining the operation of a memory device according to an embodiment.
Figure 12B:
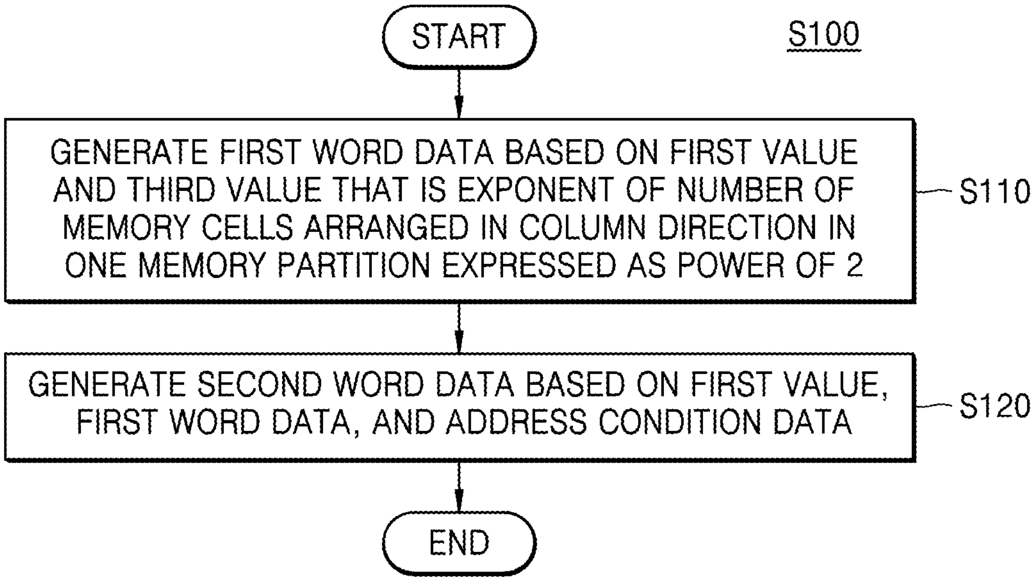

FIGS. 12A and 12B are flowcharts explaining an operation of a memory device according to an embodiment. FIGS. 12A and 12B may be described below with reference to FIGS. 4 to 11E. Here, the operating method of the memory device 100 may be referred to as a testing method for the memory module 120.

Referring to FIGS. 1 and 12A, operation S100, the pattern generator 111 may generate a pattern of a memory cell array including diagonal patterns with intervals corresponding to the second value based on the first value. Here, the first value may be an exponent of the second value expressed as a power of 2. That is, the first value may be d described above, and the second value may be I described above.

In addition, the memory module 120 may include a plurality of memory partitions and a plurality of input/output circuits. Here, the same number of memory cells may be arranged in each of the plurality of memory partitions in the column direction. In addition, the number of input/output circuits may be equal to the number of memory partitions, and each of the plurality of input/output circuits may input data into one memory partition in 1-bit units.

Referring to FIGS. 12A and 12B, operation S100 may include operations S110 and S120. Referring to FIG. 7, the pattern generator 200 may include a first pattern generator 210 and a second pattern generator 220.

In operation S110, the first pattern generator 210 may generate first word data based on the first value (e.g., d) and the third value (e.g., a) that is an exponent of the number of memory cells arranged in the column direction in one memory partition expressed as a power of 2. Here, the first word data may be intermediate data for generating the second word data.

When the first value (e.g. d) is greater than the third value (e.g. a), the first pattern generator 210 may generate the first word data based on a bit string representing the location information of the memory partition and a bit string representing the row address of the memory cell.

For example, when the value of d is greater than the value of a, the first pattern generator 210 may generate first word data, M[Z−1:0], based on Equation 1 described above.

In addition, when the first value (e.g., d) is less than or equal to the third value (e.g., a), the first pattern generator 210 may generate first word data such that the values of all bits of the first word data are 1.

In operation S120, the second pattern generator 220 may generate the second word data based on the first value, first word data, and address condition data. Here, the second word data may be data per operation of a plurality of input/output circuits that the plurality of input/output circuits input to a plurality of memory partitions so that bit values of memory cells included in the memory cell array correspond to the pattern.

In addition, the address condition data may include a relational expression between the column address of the memory cell and the row address of the memory cell. For example, the address condition data may include a specific relational expression between a bit string representing a row address XA and a bit string representing a column address YA.

When the first value (e.g., d) is 0, the second pattern generator 220 may generate the second word data such that the second word data is the same as the first word data.

For example, when the value of d is 0, the second pattern generator 220 may generate W[Z−1:0], which is the second word data, so that W[Z−1:0], which is the second word data, is the same as M[Z−1:0], which is the first word data.

That is, when d=0, W[Z−1:0] may be equal to M[Z−1:0].

When the value of d is greater than 0 and less than the value of a, XA[d−1:0]=YA[d−1:0], the second pattern generator 220 may generate the second word data so that the second word data is the same as the first word data. When the value of d is greater than 0 and less than the value of a, XA[d−1:0]+YA[d−1:0], the second pattern generator 220 may generate the second word data such that the values of all bits of the second word data are 0.

That is, when 0<d<a and XA[d−1:0]=YA[d−1:0], W[Z−1:0] may be equal to M[Z−1:0], and when 0<d<a and XA[d−1:0]≠YA[d−1:0], the W[Z−1:0] may be 0.

When the value of d is equal to or greater than the value of a, is equal to or less than the value of b, and XA[a−1:0]=YA[a−1:0], the second pattern generator 220 may generate the second word data so that the second word data is the same as the first word data. When the value of d is equal to or greater than the value of a, is equal to or less than the value of b, and XA[a−1:0]≠YA[a−1:0], the second pattern generator 220 may generate the second word data such that the values of all bits of the second word data are 0.

That is, when a≤d≤b and XA[a−1:0]=YA[a−1:0], W[Z−1:0] may be equal to M[Z−1:0], and when a≤d≤b and XA[a−1:0]+YA[a−1:0], W[Z−1:0] may be 0.

Moreover, the second pattern generator 220 may generate third word data by inverting the odd bits of the second word data and provide the third word data instead of the second word data to the plurality of input/output circuits. This may be explained in detail with reference to FIG. 11C.

According to an embodiment, by adjusting the interval I between the diagonal patterns, the degree of interference received by adjacent memory cells included in the memory module 120 is intensified, which has the effect of quickly detecting defects. For example, referring to FIG. 5, by sequentially reducing the interval I between the diagonal patterns to 8, 4, and 2, defects according to the degree of interference received by adjacent memory cells included in the memory module 120 may be quickly detected at regular intervals. Thus, while the random patterns of the comparative example cannot test for defects according to the degree of interference received by adjacent memory cells at regular intervals, the diagonal patterns of embodiments can quickly test for defects according to the degree of interference received by adjacent memory cells at regular intervals.

According to an embodiment, in addition to generating a pattern with a diagonal interval corresponding to the second value (e.g., I) based on the first value (e.g., d), there is an effect of generating various patterns by controlling the signal P and the signal DCE.

Embodiments may have the effect of improving test coverage by generating various test patterns.

FIGS. 13A to 13F are block diagrams showing examples of test systems or memory systems according to an embodiment.

Referring to FIGS. 13A to 13F, various structures of a test system or memory system according to embodiments are described, but embodiments are not limited thereto. Hereinafter, for convenience of explanation, detailed descriptions of the components described above are omitted.

Figure 13A:
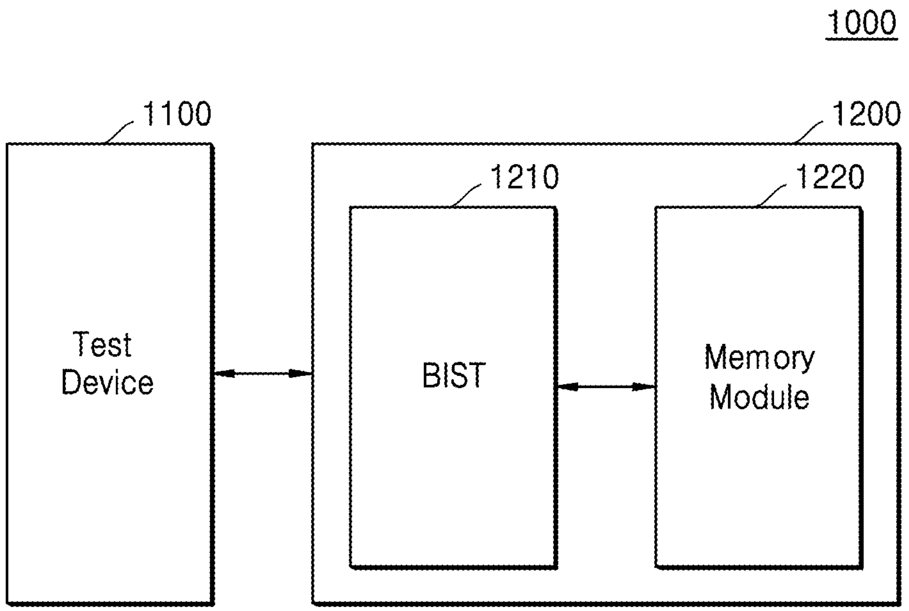
FIGS. 13A to 13F are block diagrams showing examples of test systems or memory systems according to an embodiment.

FIG. 13A is a block diagram showing an example of a test system according to an embodiment. Referring to FIG. 13A, a test system 1000 may include a test device 1100 and a memory device 1200. The memory device 1200 may include a BIST logic 1210 and a memory module 1220. The BIST logic 1210 may operate based on the test method described with reference to FIGS. 1 to 12.

In an embodiment, the test device 1100 may be an automated test equipment (ATE) that tests the memory device 1200. The test device 1100 may output a signal for testing the memory device 1200 to the memory device 1200. For example, the test device 1100 may output a test activation signal TEST_EN to start the test to the memory device 1200. The test device 1100 may receive test results from the memory device 1200.

Figure 13B:
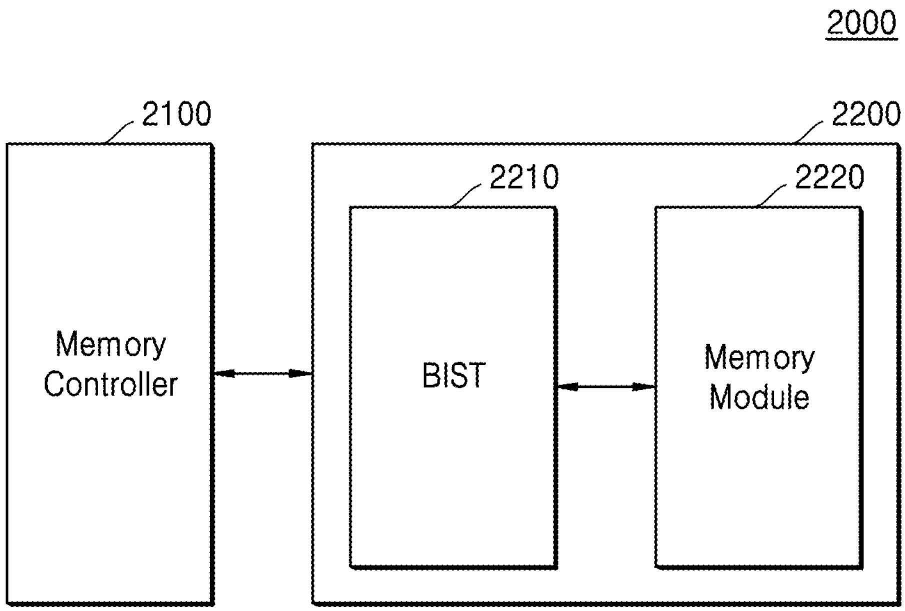

FIG. 13B is a block diagram showing an example of a memory system according to an embodiment. Referring to FIG. 13B, the memory system 2000 may include a memory controller 2100 and a memory device 2200. The memory controller 2100 may store data in the memory device 2200 or read data stored in the memory device 2200. The memory device 2200 may operate under the control of the memory controller 2100.

The memory device 2200 may include a BIST logic 2210 and a memory module 1220. BIST logic 1210 may operate based on the test method described with reference to FIGS. 1 to 12.

Figure 13C:
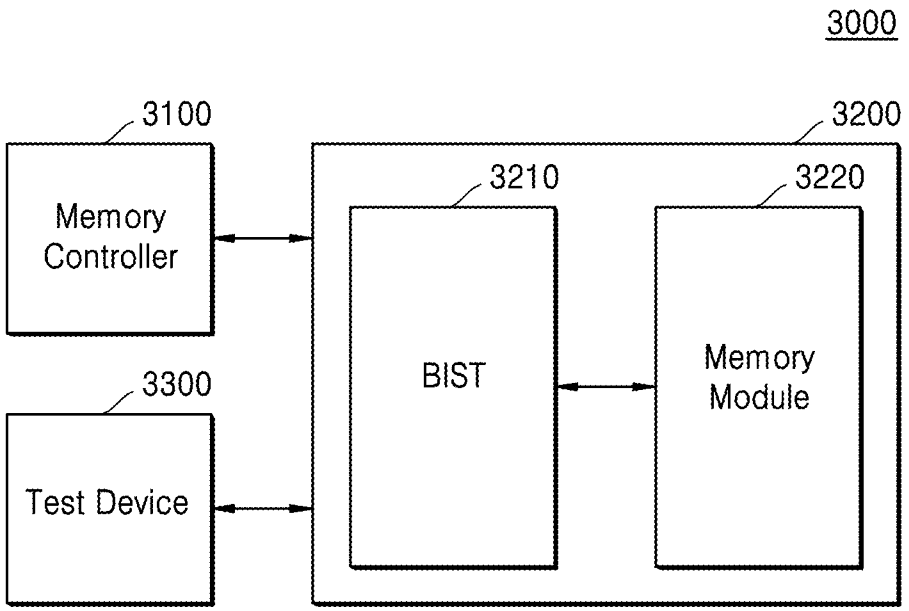

FIG. 13C is a block diagram showing an example of a memory system according to an embodiment. Referring to FIG. 13C, a memory system 3000 may include a memory controller 3100, a memory device 3200, and a test device 3300. The memory device 3200 may include a BIST logic 3210 and a memory module 3220. The BIST logic 1210 may operate based on the test method described with reference to FIGS. 1 to 12.

In an embodiment, the memory controller 3100 may store data in the memory device 3200 or read data stored in the memory device 3200. The memory device 3200 may operate under the control of the memory controller 3100. The test device 3300 may be an ATE that tests the memory device 3200.

Figure 13D:
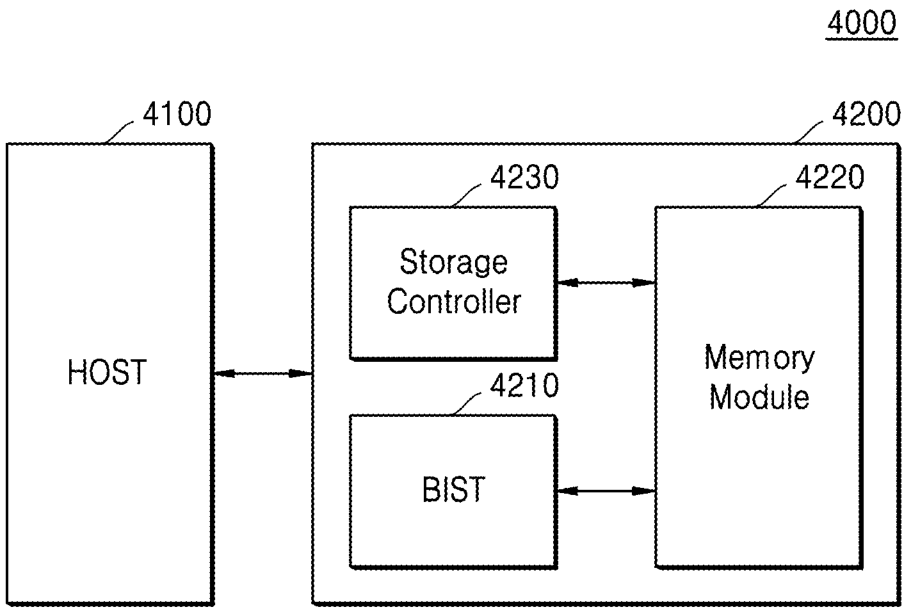

FIG. 13D is a block diagram showing an example of a memory system according to an embodiment. Referring to FIG. 13D, a memory system 4000 may include a host 4100 and a storage device 4200. The storage device 4200 may include a BIST logic 4210, a memory module 4220, and a storage controller 4230. The BIST logic 4210 may operate based on the test method described with reference to FIGS. 1 to 12.

In an embodiment, the storage controller 4230 may be configured to process various requests from the host 4100. For example, the storage controller 4230 may store data in the memory module 4220 or read the stored data in response to the request of the host 4100.

Figure 13E:
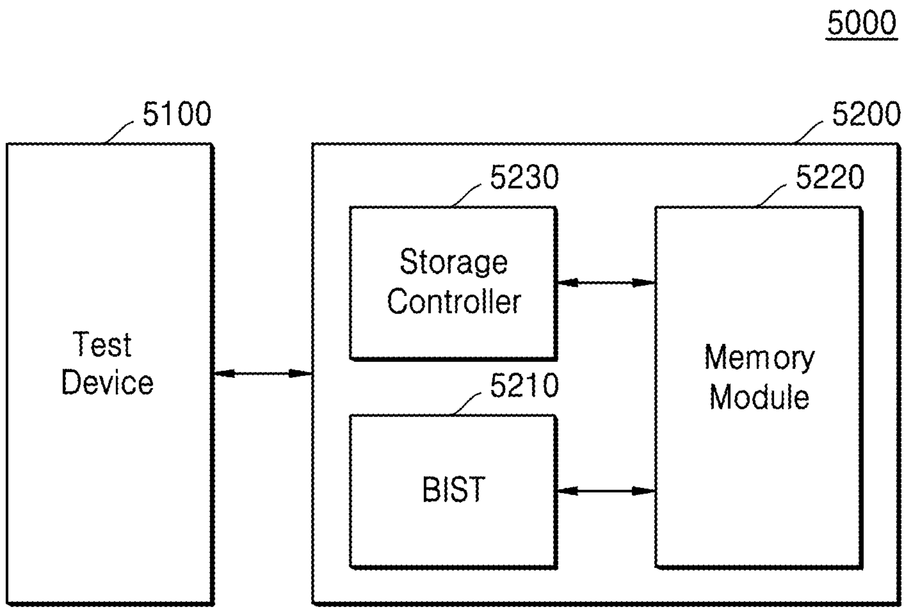

FIG. 13E is a block diagram illustrating a test system according to an embodiment. Referring to FIG. 13E, a test system 5000 may include a test device 5100 and a storage device 5200. The storage device 5200 may include a BIST logic 5210, a memory module 5220, and a storage controller 5230. The BIST logic 5210 may operate based on the test method described with reference to FIGS. 1 to 12.

Figure 13F:
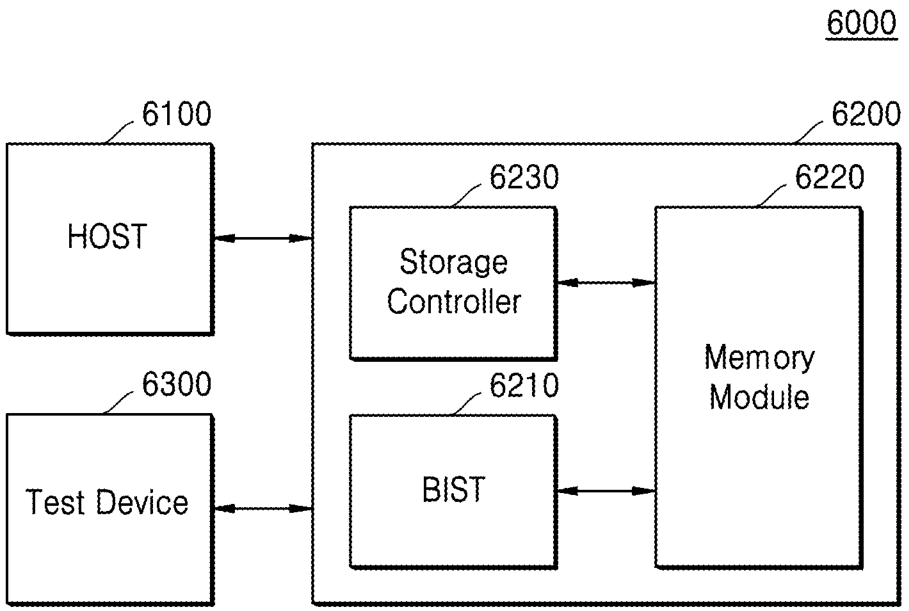

FIG. 13F is a block diagram illustrating a memory system according to an embodiment. Referring to FIG. 13F, a memory system 6000 may include a host 6100, a storage device 6200, and a test device 6300. The storage device 6200 may include a BIST logic 6210, a memory module 6220, and a storage controller 6230. BIST logic 6210 may operate based on the test method described with reference to FIGS. 1 to 12.

Various changes in form and details may be made therein without departing from the spirit and scope of the following claims.

What is claimed is:

1. A memory device comprising:

a memory module comprising a memory cell array and a plurality of input/output circuits, wherein the memory cell array comprises a plurality of memory partitions, a same number of memory cells are arranged in a column direction in each of the plurality of memory partitions, a number of the plurality of input/output circuits is equal to a number of the plurality of memory partitions, and each of the plurality of input/output circuits inputs data into one memory partition in 1-bit units; and a test logic circuit configured to perform a self-test on the memory module, wherein the test logic circuit comprises a pattern generator configured to generate a pattern of the memory cell array comprising diagonal patterns with an interval corresponding to a second value I based on a first value d, and $I=2^d$.

2. The memory device of claim 1, wherein the pattern generator comprises:

a first pattern generator configured to generate first word data based on the first value d and a third value a, and the number of memory cells arranged in the column direction in the one memory partition is $2^a$; and a second pattern generator configured to generate second word data based on the first value d, the first word data, and address condition data, wherein the first word data is intermediate data for generating the second word data, wherein the second word data is data per operation of the plurality of input/output circuits that the plurality of input/output circuits input to the plurality of memory partitions so that bit values of memory cells in the memory cell array correspond to the pattern, and wherein the address condition data comprises a relational expression between a column address of a memory cell of the memory cell array and a row address of the memory cell.

3. The memory device of claim 2, wherein the first pattern generator is further configured to, based on the first value d being greater than the third value a, generate the first word data based on a bit string representing location information of a memory partition of the plurality of memory partitions and a bit string representing the row address of the memory cell.

4. The memory device of claim 2, wherein the first pattern generator is further configured to, based on the first value d being greater than the third value a, generate the first word data according to:

$$M[\text{INDEX}] = (\text{INDEX}[d-a-1:0] == XA[d-1:a]),$$

where M[Z−1:0] is the first word data, the INDEX is a value representing location information of a memory partition of the plurality of memory partitions, M[INDEX] represents a value of an INDEX-th bit among M[Z−1;0], INDEX[d−a−1:0] refers to a first bit string including a value of the 0th bit to a value of the (d−a−1)th bit among first bit strings representing INDEX, and XA[d−1:a] refers to a second bit string including a value of an a-th bit to a value of a (d−1)th bit among second bit strings representing the column address.

5. The memory device of claim 2, wherein the first pattern generator is further configured to, based on the first value d being less than or equal to the third value a, generate the first word data such that values of all bits of the first word data are 1.

6. The memory device of claim 2, wherein the second pattern generator is further configured to, based on the first value d being 0, generate the second word data so that the second word data is the same as the first word data.

7. The memory device of claim 2, wherein the second pattern generator is further configured to, based on the first value d being greater than 0 and less than the third value a and XA[d−1:0] being equal to YA[d−1:0], generate the second word data such that the second word data is the same as the first word data, where XA[d−1:0] refers to a first bit string including a value of a 0th bit to a d−1th bit among first bit strings representing the row address of the memory cell, and YA[d−1:0] refers to a second bit string including a value of a 0th bit to a d−1th bit among second bit strings representing the column address of the memory cell.

8. The memory device of claim 2, wherein the second pattern generator is further configured to, based on the first value d being equal to or greater than the third value a and XA[a−1:0] being equal to YA[a−1:0], generate the second word data such that the second word data is the same as the first word data, and where XA[a−1:0] refers to a first bit string representing a value of the 0th bit to the value of the a−1th bit among first bit strings representing the row address of the memory cell, and YA[a−1:0] refers to a second bit string including the value of the 0th bit to the value of the a−1th bit among second bit strings representing the column address of the memory cell.

9. The memory device of claim 2, wherein the second pattern generator is further configured to:

generate third word data by inverting odd bits of the second word data, and provide the third word data instead of the second word data to the plurality of input/output circuits.

10. A test method for a memory module that comprises a memory cell array and a plurality of input/output circuits, wherein the memory cell array comprises a plurality of memory partitions, a same number of memory cells are arranged in a column direction in each of the plurality of memory partitions, a number of the plurality of input/output circuits is equal to a number of the plurality of memory partitions, and each of the plurality of input/output circuits inputs data into one memory partition in 1-bit units, the test method comprising:

generating a pattern comprising diagonal patterns with interval corresponding to a second value I based on a first value d, wherein $I=2^d$; and testing the memory module with the pattern.

11. The test method of claim 10, wherein the generating the pattern comprises:

generating first word data based on the first value d and a third value a, wherein the number of memory cells arranged in the column direction in the one memory partition is $2^a$; and generating second word data based on the first value, the first word data, and address condition data, wherein the first word data is intermediate data for generating the second word data, wherein the second word data is data per operation of the plurality of input/output circuits that the plurality of input/output circuits input to the plurality of memory partitions so that bit values of memory cells in the memory cell array correspond to the pattern, and wherein the address condition data comprises a relational expression between a column address of a memory cell of the memory cell array and a row address of the memory cell.

12. The test method of claim 11, wherein the generating the first word data comprises, based on the first value being greater than the third value, generating the first word data based on a bit string representing location information of a memory partition of the plurality of memory partitions and a bit string representing the row address of the memory cell.

13. The test method of claim 11, wherein the generating the first word data comprises, based on the first value d being greater than the third value a, generating the first word data according to:

$$M[\text{INDEX}] = (\text{INDEX}[d-a-1:0] == XA[d-1:a]),$$

where M[Z−1:0] is the first word data, the INDEX is a value representing location information of a memory partition of the plurality of memory partitions, M[INDEX] represents a value of an INDEX-th bit among M[Z−1;0], INDEX[d−a−1:0] refers to a first bit string including a value of the 0th bit to a value of the (d−a−1)th bit among first bit strings representing INDEX, and XA[d−1:a] refers to a second bit string including a value of the a-th bit to a value of a (d−1)th bit among second bit strings representing the column address.

14. The test method of claim 11, wherein the generating the first word data comprises, based on the first value d being less than or equal to the third value a, generating the first word data such that values of all bits of the first word data are 1.

15. The test method of claim 11, wherein the generating the second word data comprises, based on the first value being 0, generating the second word data so that the second word data is the same as the first word data.

16. The test method of claim 11, wherein the generating the second word data comprises, based on the first value d being greater than 0 and less than the third value a and XA[d−1:0] being equal to YA[d−1:0], generating the second word data such that the second word data is identical to the first word data, wherein XA[d−1:0] refers to a first bit string including a value of a 0th bit to a d−1th bit among first bit strings representing the row address of the memory cell, and YA[d−1:0] refers to a second bit string including a value of a 0th bit to a d−1th bit among second bit strings representing the column address of the memory cell.

17. The test method of claim 11, wherein the generating the second word data comprises, based on the first value d being equal to or greater than the third value a and XA[a−1:0] is equal to YA[a−1:0], generating the second word data such that the second word data is the same as the first word data, where XA[a−1:0] refers to a first bit string representing a value of the 0th bit to a value of the a−1th bit among first bit strings representing the row address of the memory cell, and YA[a−1:0] refers to a second bit string representing a value of a 0th bit to a value of an a−1th bit among second bit strings representing the column address of the memory cell.

18. The test method of claim 11, wherein the generating the second word data comprises:

generating third word data by inverting odd bits of the second word data; and providing the third word data instead of the second word data to the plurality of input/output circuits.

19. A test logic circuit configured to perform a self-test on a memory module, the test logic circuit comprising:

the memory module comprising a memory cell array and a plurality of input/output circuits, wherein the memory cell array comprises a plurality of memory partitions, a same number of memory cells are arranged in a column direction in each of the plurality of memory partitions, a number of the plurality of input/output circuits is equal to a number of the plurality of memory partitions, and each of the plurality of input/output circuits inputs data into one memory partition in 1-bit units; and a pattern generator configured to generate a pattern of the memory cell array comprising diagonal patterns with interval corresponding to a second value I based on a first value d, and I=24.

20. The test logic circuit of claim 19, wherein the pattern generator comprises:

a first pattern generator configured to generate first word data based on the first value d and a third value a, wherein the number of memory cells arranged in the column direction in the one memory partition is $2^a$; and a second pattern generator configured to generate second word data based on the first value, the first word data, and address condition data, wherein the first word data is intermediate data for generating the second word data, wherein the second word data is data per operation of the plurality of input/output circuits that the plurality of input/output circuits input to the plurality of memory partitions so that bit values of memory cells included in the memory cell array correspond to the pattern, and wherein the address condition data includes a relational expression between a column address of a memory cell of the memory cell array and a row address of the memory cell.

* * * * *